(12) United States Patent
Ye et al.

(10) Patent No.: US 8,577,902 B1
(45) Date of Patent: Nov. 5, 2013

(54) DATA ORGANIZATION AND INDEXING RELATED TECHNOLOGY

(75) Inventors: Alex Ye, Hong Kong (CN); Benjamin Z. Li, McLean, VA (US)

(73) Assignee: MicroStrategy Incorporated, McLean, VA (US)

( * ) Notice: Subject to any disclaimer, the term of this patent is extended or adjusted under 35 U.S.C. 154(b) by 170 days.

(21) Appl. No.: 12/777,631

(22) Filed: May 11, 2010

Related U.S. Application Data

(60) Provisional application No. 61/177,471, filed on May 12, 2009.

(51) Int. Cl.
*G06F 7/00* (2006.01)
*G06F 17/30* (2006.01)

(52) U.S. Cl.
USPC ............ 707/752; 707/693; 707/737; 707/756

(58) Field of Classification Search
USPC .................................. 707/693, 737, 752, 756
See application file for complete search history.

(56) References Cited

U.S. PATENT DOCUMENTS

| | | | | |
|---|---|---|---|---|
| 5,603,022 A * | 2/1997 | Ng et al. | ........................ | 707/693 |
| 5,678,043 A * | 10/1997 | Ng et al. | ........................ | 707/693 |
| 5,918,225 A * | 6/1999 | White et al. | ........................ | 1/1 |
| 6,594,678 B1 * | 7/2003 | Stoutamire et al. | ................... | 1/1 |
| 7,548,928 B1 * | 6/2009 | Dean et al. | ........................... | 1/1 |
| 7,865,495 B1 | 1/2011 | Roizen et al. | | |
| 2003/0212694 A1 * | 11/2003 | Potapov et al. | ............... | 707/100 |
| 2004/0034616 A1 * | 2/2004 | Witkowski et al. | ............... | 707/1 |
| 2008/0040348 A1 * | 2/2008 | Lawande et al. | .................. | 707/7 |
| 2008/0294676 A1 * | 11/2008 | Faerber et al. | ..................... | 707/102 |
| 2009/0144235 A1 * | 6/2009 | Bhide et al. | ....................... | 707/3 |
| 2009/0313210 A1 * | 12/2009 | Bestgen et al. | .................... | 707/2 |
| 2010/0030796 A1 * | 2/2010 | Netz et al. | ...................... | 707/101 |
| 2010/0088309 A1 * | 4/2010 | Petculescu et al. | ........... | 707/714 |
| 2010/0088315 A1 * | 4/2010 | Netz et al. | ...................... | 707/737 |
| 2010/0088352 A1 * | 4/2010 | Hendrickson et al. | ........ | 707/808 |

* cited by examiner

*Primary Examiner* — Shew-Fen Lin
(74) *Attorney, Agent, or Firm* — Fish & Richardson P.C.

(57) ABSTRACT

Data organization and indexing, in which data that includes information for multiple attribute classes is accessed and redundancy characteristics of the accessed data within each of at least two of the multiple attribute classes are identified. Based on the identified redundancy characteristics, a relative order among the multiple attribute classes of the accessed data is determined and the accessed data is organized based on the determined relative order. The organized data is compressed using run length encoding and an index that is descriptive of the compressed data is generated. The encoded data and the generated index are stored to enable subsequent searching of the encoded data using the generated index.

17 Claims, 10 Drawing Sheets

| | 611 | 612 | 613 | 614 | 615 |
|---|---|---|---|---|---|
| 610 | Month | Year | State | City | Sales Metric |
| 621 | 07/01 | 07 | VA | Vienna | 1.2 |
| 622 | 06/02 | 06 | VA | Vienna | 1.4 |
| 623 | 06/01 | 06 | VA | McLean | 0.8 |
| 624 | 06/02 | 06 | VA | McLean | 1.7 |
| 625 | 06/02 | 06 | NY | New York | 2.0 |
| 626 | 07/01 | 07 | NY | New York | 2.2 |
| 627 | 07/01 | 07 | MD | Baltimore | 1.6 |

| | 612 | 611 | 613 | 614 | 615 |
|---|---|---|---|---|---|
| 630 | Year | Month | State | City | Sales Metric |
| 623 | 06 | 06/01 | VA | McLean | 0.8 |
| 625 | 06 | 06/02 | NY | New York | 2.0 |
| 624 | 06 | 06/02 | VA | McLean | 1.7 |
| 622 | 06 | 06/02 | VA | Vienna | 1.4 |
| 626 | 07 | 07/01 | NY | New York | 2.2 |
| 627 | 07 | 07/01 | MD | Baltimore | 1.6 |
| 621 | 07 | 07/01 | VA | Vienna | 1.2 |

| | 612 | 611 | 613 | 614 | 615 |
|---|---|---|---|---|---|
| 640 | Year | Month | State | City | Sales Metric |
| 643 | 06 | 06/01 | VA | McLean | 0.8 |
| 641 | | 06/02 | NY | New York | 2.0 |
| 644 | | | VA | McLean | 1.7 |
| 646 | | | VA | Vienna | 1.4 |
| 642 | 07 | 07/01 | NY | New York | 2.2 |
| | | | MD | Baltimore | 1.6 |
| 645 | | | VA | Vienna | 1.2 |

FIG. 6

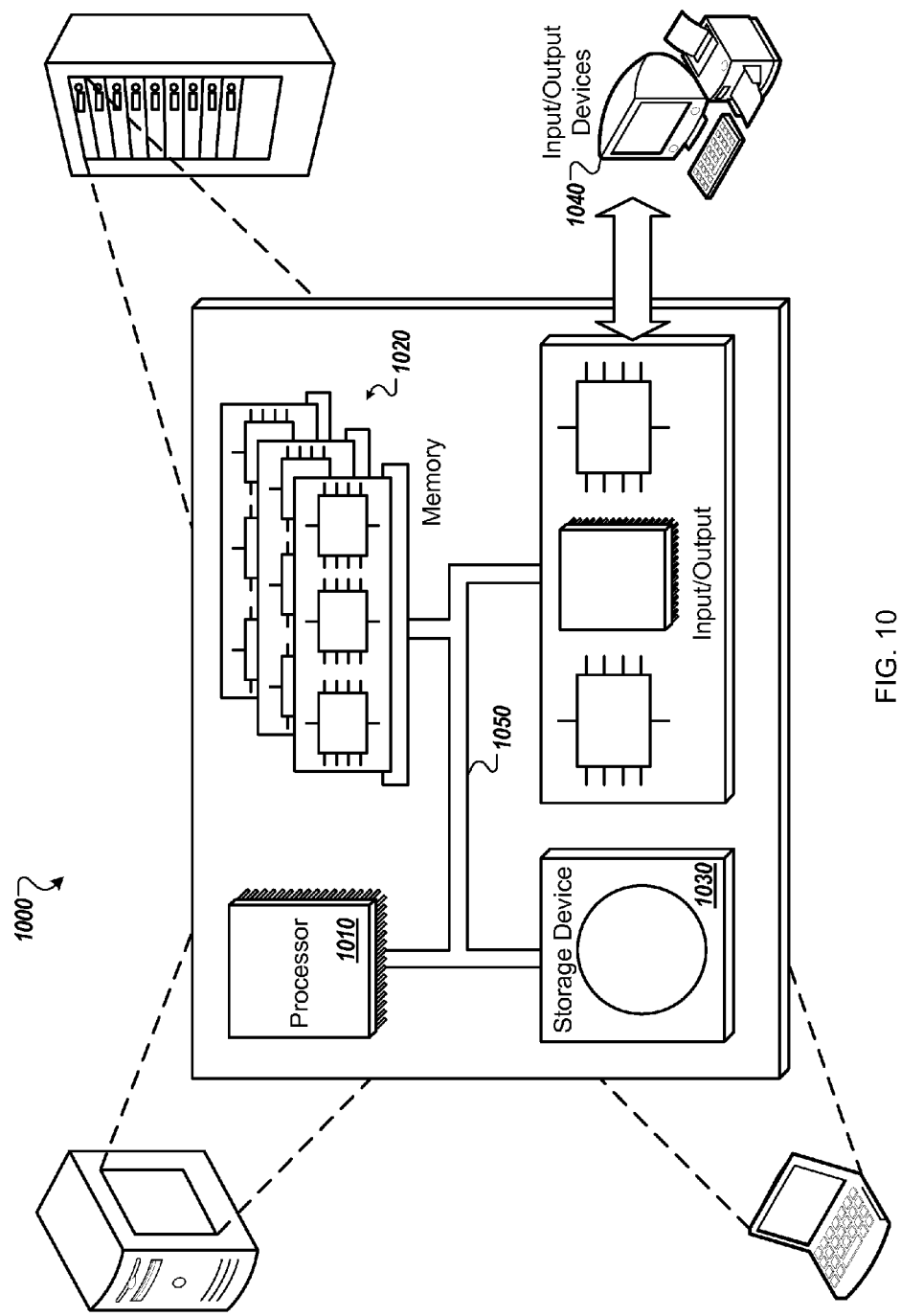

DATA ORGANIZATION AND INDEXING RELATED TECHNOLOGY

CROSS REFERENCE TO RELATED APPLICATIONS

The present application claims priority to U.S. Provisional Application No. 61/177,471, filed May 12, 2009, which is incorporated herein by reference in its entirety for all purposes.

TECHNICAL FIELD

This disclosure relates to data organization and indexing related technology.

BACKGROUND

Computer systems are used to manage and store data. As such, they may be used to analyze data and generate reports based on the analysis results. For instance, computer systems may group and filter data and calculate metric values based on the grouped and filtered data, ultimately providing a report including the calculated metric values.

SUMMARY

In one aspect, this disclosure relates to data organization and indexing technology.

Implementations of any of the techniques described throughout the disclosure may include a method or process, a system, or instructions stored on a computer-readable storage device. The details of particular implementations are set forth in the accompanying drawings and description below. Other features will be apparent from the following description, including the drawings, and the claims.

DESCRIPTION OF DRAWINGS

FIGS. 2 and 10 are diagrams of exemplary systems.
FIGS. 6-8 are diagrams of exemplary data structures.

DETAILED DESCRIPTION

In some implementations, a system may increase speed and/or efficiency of grouping and/or filtering operations performed in generating service reports for data stored in a data repository (e.g., a database). In these implementations, the system may organize the data stored in the database or data repository in a manner that reduces the time spent in performing grouping and filtering operations. Using the organized data, the time for grouping and filtering operations may be reduced or made negligible as compared to the time in real calculation and, therefore, performance of view report execution may be improved.

For example, the system may represent attribute information of the data using blocks. The system may first re-order and sort the attribute information and compress the data into blocks using run-length encoding. The system then may build an index on the blocks, and may use the blocks and index structure to perform filtering and grouping operations in a relatively efficient manner.

Figure 1:
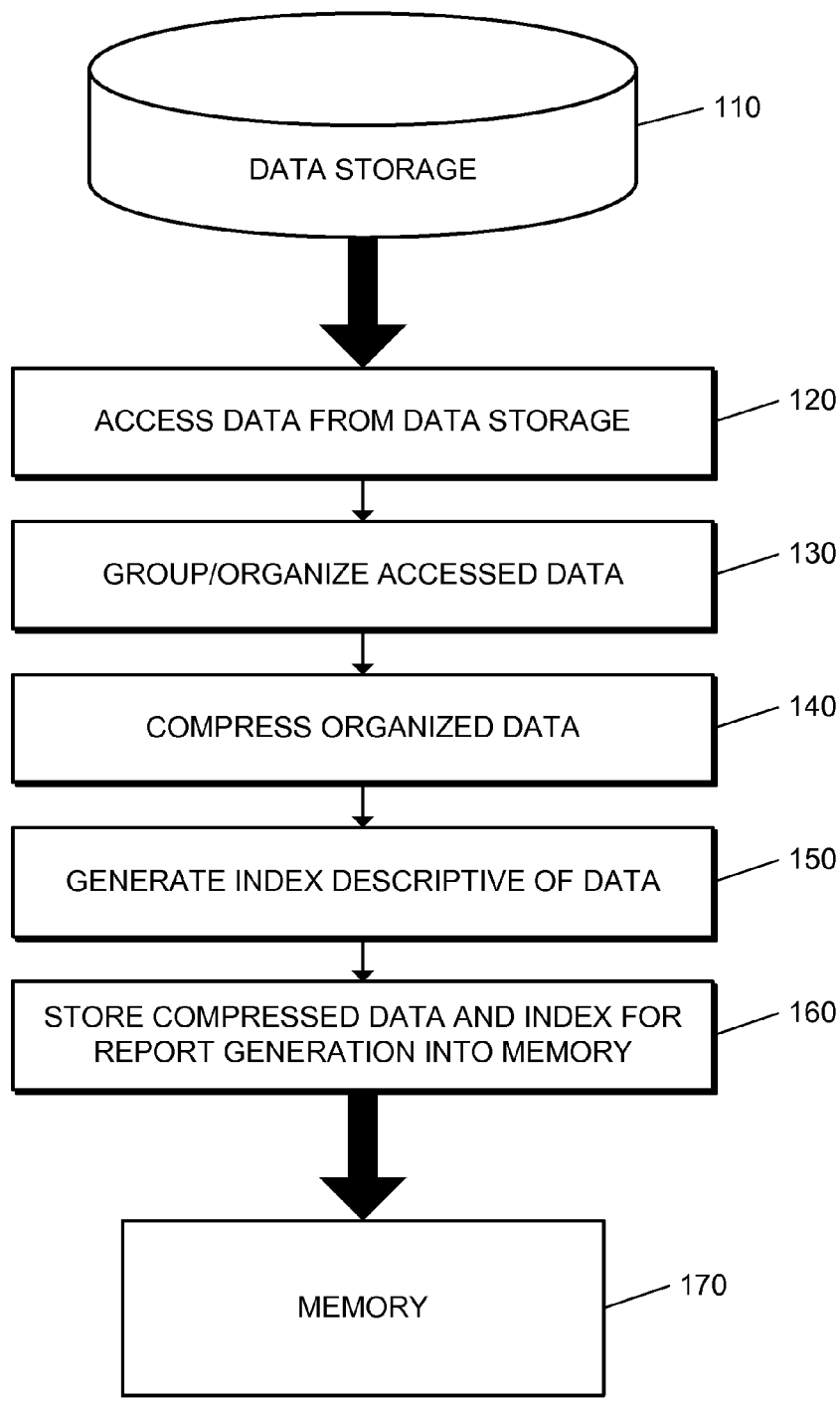
FIGS. 1, 3-5 and 9 are flowcharts of exemplary processes.

FIG. 1 illustrates a process for organizing data and generating an index of the organized data for report generation. The process shown in FIG. 1 is described generally as being performed by a processor. In some implementations, the process shown in FIG. 1 may be performed by one or more processors included in one or more electronic devices or may be performed any type of electronic device (e.g., a server, a computer, etc.).

The processor accesses data from a data storage 110 (120). For instance, the processor may retrieve data from a database or data warehouse using a data access command or a query (e.g., an SQL query statement). The processor may access data over a direct connection to the data storage 110 or over a network.

In some examples, the processor defines relationships between data attribute classes for the data stored in the data storage 110 based on input provided by a database architect. For instance, based on input from the architect, the processor may structure the data to be stored as cubes that have dimensions defining relationships between attribute classes. Each dimension may define related attribute classes in a parent-child relationship (e.g., a dimension of time may have a parent class of "year" and child classes of "month," "day," and "hour"). The processor may determine what data to access from the data storage 110 based the type of data queried by users (e.g., data of dimensions of interest as identified by a client) or based on input provided by a database architect. The processor may access the data identified by the database architect as being of interest without accessing all of the data stored in the data storage 110.

The processor groups or organizes the accessed data (130). The processor may process the data accessed from the data storage 110 and group or organize the data in a manner that is more efficient than the manner in which the data is stored in the data storage 110. For example, the processor may rearrange relationships of attribute classes in the data differently than the data storage 110. In this example, the processor may arrange columns of data in a table differently than a table stored in the data storage 110. The processor also may sort the accessed data to group similar (or the same) data values together within the accessed data. The processor further may filter any of the accessed data that is not needed for report generation.

In some implementations, the processor may determine how to group or organize the accessed data by identifying redundancies within the accessed data and organizing the data in a manner that leverages the identified redundancies. By leveraging the identified redundancies, the processor may be able to reduce the storage capacity needed to the store the accessed data and also may be able to reduce the processing time needed to locate relevant portions of the accessed data. Grouping and organizing accessed data based on identified redundancies is described in more detail below with respect to FIGS. 3-5.

The processor compresses the organized data (140). Based on the organization of the data, the processor may compress the data to reduce the storage size of the data and reduce the number of operations needed to be performed to identify relevant portions of the data (e.g., reduce the number of comparisons needed to be made to execute a query). The processor may compress data within particular attribute classes using run length encoding to generate a set of blocks of the same data values for the corresponding attribute class. The blocks may require less storage capacity then the accessed data and evaluating operations for the blocks may be more efficient than evaluating operations on individual records within the accessed data.

The processor generates an index that is descriptive of the organized data (150). The index may be a data structure that defines the organization of the data. For instance, when the data is organized and compressed into blocks, the index may identify blocks within the organized data and identify relationships between the blocks in the organized data. The relationships may indicate whether blocks are within the same attribute class and whether a particular block is related to other blocks within other attribute classes (e.g., whether the block has a parent block associated with a parent attribute class and/or whether the block has a child block associated with a child attribute class). The processor may generate the index by identifying the blocks within the organized and compressed data, determining relationships between the identified blocks, and generating data that is descriptive of the identified blocks and determined relationships.

The processor also may store addressing information (e.g., row numbers) for each of the identified blocks to enable future accesses of data stored within identified blocks by referencing the index. The processor may use the index to improve the speed of operations on the accessed data by providing efficient access of ordered records.

The processor stores the compressed data and the index for report generation into a memory 170 (160). For instance, the processor may store the compressed data and the index into any type of random access memory. Storing the compressed data in the memory 170 may enable faster report generation because the access time of accessing data from the memory 170 may be faster than the access time of accessing data from the data storage 110. When performing a report generation process, the processor may access the index stored in the memory 170 and use the index to identify locations in the memory 170 for the relevant portions of the compressed data. The processor may access data from the identified locations in the memory 170 and use the accessed data to generate a report.

Figure 2:
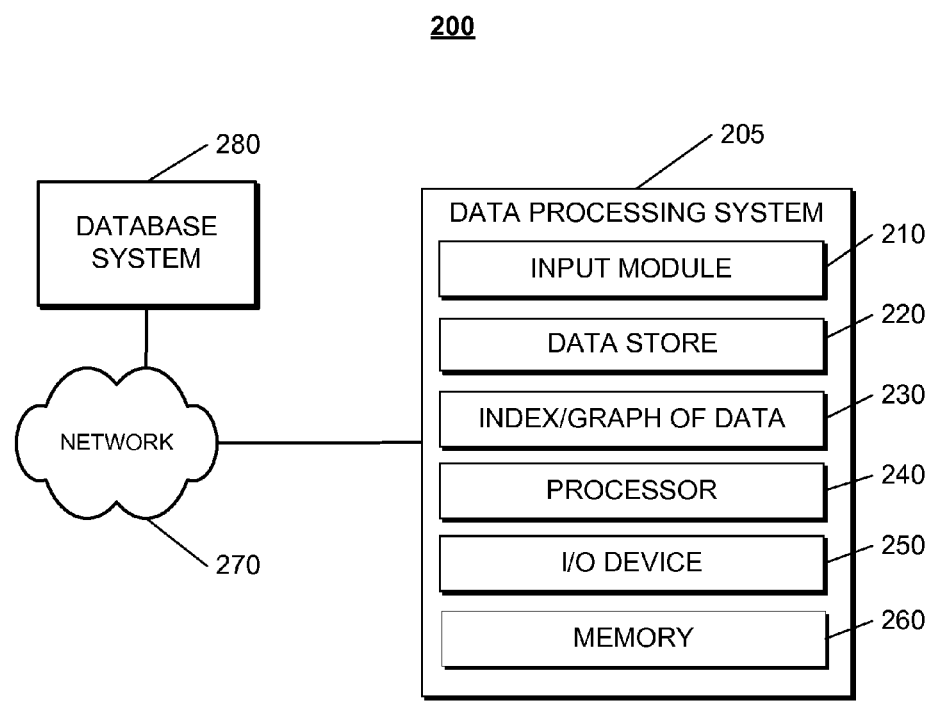

Referring to FIG. 2, a block diagram of a system 200 is shown. The system 200 includes a data processing system 205, a network 270, and a database system 280. The network 270 enables the data processing system 205 and the database system 280 to exchange electronic communications.

The data processing system 205 includes an input module 210, a data store 220, index or graph data 230, a processor 240, an input/output (I/O) device 250, and a memory 260. The data processing system 205 may be used to satisfy queries and generate reports based on data stored in the database system 280. The data processing system 205 may be a general purpose computer, server, or any other type of electronic device that includes electronic components that are capable of accessing and processing data. The data processing system 205 may be implemented within hardware or a combination of hardware and software.

The input module 210 imports data associated with a report generation process. The data may include data from a database that is used to generate a report (e.g., data from a business database or transaction processing system). The input module 210 may input data from a device (e.g., the database system 280) connected to the network 270. In some implementations, the input module 210 reformats and/or transforms the data such that the data may be processed and stored by other components within the data processing system 205.

The data processing system 205 also includes a data store 220. In some implementations, data from the input module 210 is stored in the data store 220. The data store 220 may be, for example, a database that logically organizes data into a series of database tables. The data store 220 may be a hard disk drive, non-volatile memory (e.g., Flash memory), or another type of electronic storage device.

The data processing system 205 also includes index or graph data 230. The index or graph data 230 may include a data structure that defines the organization of data that is processed in satisfaction of a report generation command. The data structure may identify relationships within the data and include addressing information that maps portions of the index or graph to actual storage locations where the data resides. In some implementations, the index or graph data 230 may be received, by the data processing system 205, from the database system 280.

The data processing system 205 also includes a processor 240. The processor 240 may be a processor suitable for the execution of a computer program such as a general or special purpose microprocessor, and any one or more processors of any kind of digital computer. Generally, a processor receives instructions and data from a read-only memory or a random access memory or both. The processor 240 receives instructions and data from the components of the data processing system 205 to, for example, organize and compress data and generate the index or graph data 230. The processor 240 also may receive instructions and data from the components of the data processing system 205 to generate a report in satisfaction of a query using the index or graph data 230. In some implementations, the data processing system 205 includes more than one processor.

The data processing system 205 also includes the I/O device 250, which is configured to allow user input. For example, the I/O device 250 may be a mouse, a keyboard, a stylus, a touch screen, a track ball, a toggle control, one or more user input buttons, a microphone, or any other device that allows a user to input data into the data processing system 205 or otherwise communicate with the data processing system 205. The I/O device 250 may receive input from a user that defines a query or a report generation command. In some implementations, the user may be a machine and the user input may be received from an automated process running on the machine. In other implementations, the user may be a person.

The I/O device 250 also may include a device configured to output generated reports and status information. For instance, the I/O device 250 may include a display device configured to display generated reports and status information. The I/O device 250 also may include a speaker configured to provide audible output.

The data processing system 205 also includes a memory 260. The memory 260 may be any type of tangible machine-readable storage medium. The memory 260 may, for example, store the data included in the data store 220 and/or the index or graph data 230. In some implementations, the memory 260 may store instructions that, when executed, cause the data processing system 205 to, for example, organize and compress data and generate the index or graph data 230.

The system 200 also includes a network 270. The network 270 is configured to enable exchange of electronic communications between devices connected to the network 270. For example, the network 270 may be configured to enable exchange of electronic communications between the data processing system 205 and the database system 280. The network 270 may include, for example, one or more of the Internet, Wide Area Networks (WANs), Local Area Networks (LANs), analog or digital wired and wireless telephone networks (e.g., a PSTN, Integrated Services Digital Network (ISDN), a cellular network, and Digital Subscriber Line (DSL)), radio, television, cable, satellite, or any other delivery or tunneling mechanism for carrying data. Network 270 may include multiple networks or subnetworks, each of which may include, for example, a wired or wireless data pathway. The network 270 may include a circuit-switched network, a packet-switched data network, or any other network able to carry electronic communications. For example, the network 270 may include networks based on the Internet protocol (IP) or asynchronous transfer mode (ATM).

The database system 280 is an electronic device configured to store data and exchange communications with the data processing system 205 (e.g., multiple data processing systems) over the network 270. For example, the database system 280 may be configured to store an organization's data and output the organization's data in response to requests (e.g., SQL statements or queries). In this example, the database system 280 may exchange communications with the data processing system 205 to receive input defining data needed from the database system 280 and provide the data needed as output to the data processing system 205. The database system 280 may include one or more databases and/or data warehouses.

Although the example data processing system 205 is shown as a single integrated component, one or more of the modules and applications included in the data processing system 205 may be implemented separately from the data processing system 205 but in communication with the data processing system 205. For example, the data store 220 may be implemented on a centralized server that communicates and exchanges data with the data processing system 205. In this example, the database system 280 may communicate with the data processing system 205 and perform operations described above as being performed by the data processing system 205 or may perform operations that assist the data processing system 205 performing operations described throughout the disclosure.

Figure 3:
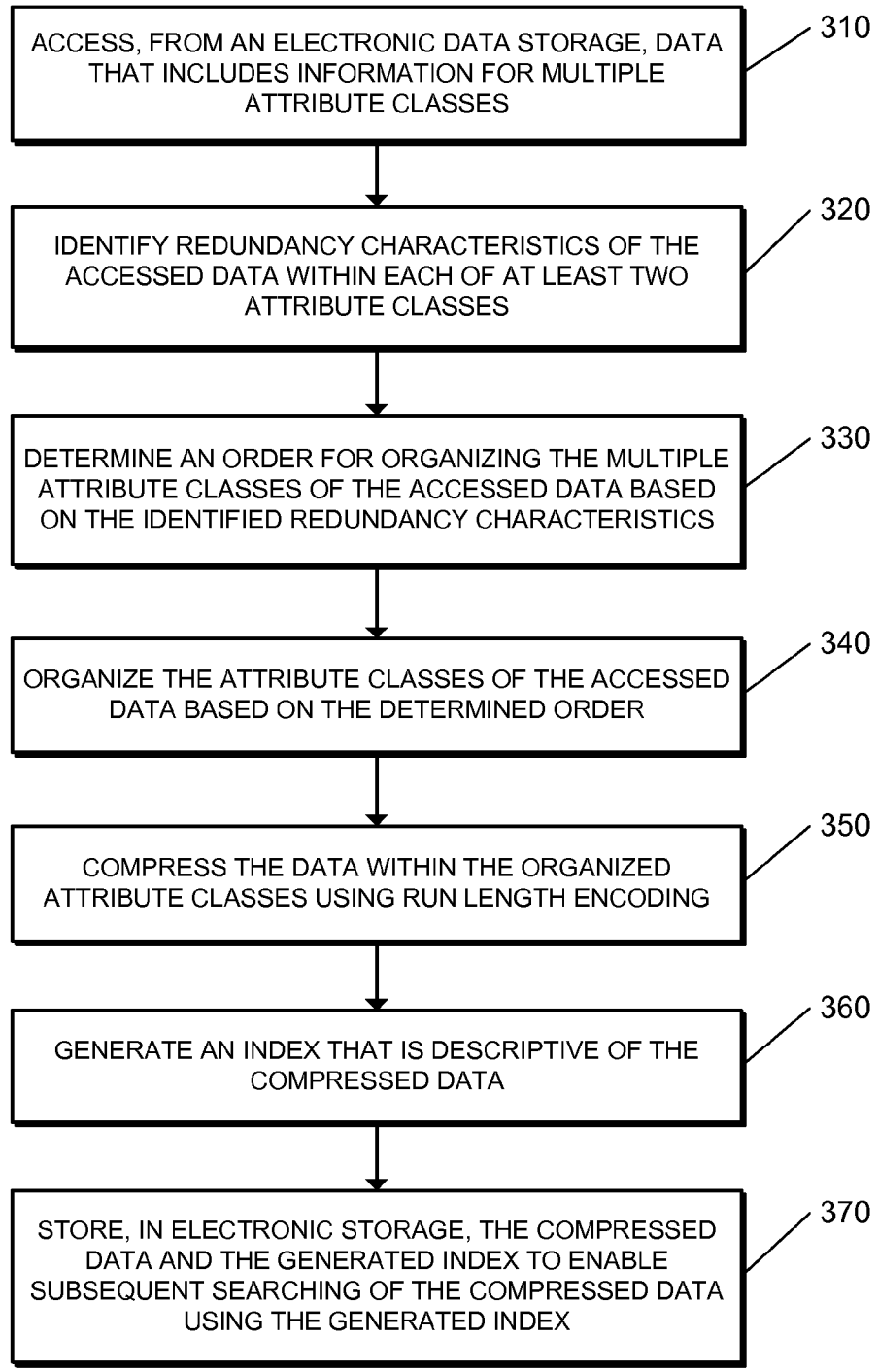

FIG. 3 illustrates a process 300 for organizing and compressing data and generating an index to enable subsequent searching of the organized and compressed data using the generated index. The operations of the process 300 are described generally as being performed by the system 200. The operations of the process 300 may be performed exclusively by the data processing system 205, may be performed exclusively by the database system 280, or may be performed by a combination of the data processing system 205 and the database system 280. In some implementations, operations of the process 300 may be performed by one or more processors included in one or more electronic devices.

The system 200 accesses, from an electronic data storage, data that includes information for multiple attribute classes (310). The system 200 may retrieve data from a database or data warehouse using a data access command or a query (e.g., an SQL query statement). For instance, the data processing system 205 may send, over the network 270, a data access request to the database system 280 and the database system 280 may send, over the network, the requested data to the data processing system 205.

Although the accessed data may not include data for all of the attribute classes for the data stored in the electronic data storage (although it may), the accessed data includes information for multiple attribute classes. For example, the accessed data may be stored as cubes that have dimensions defining relationships between attribute classes. Each dimension may define related attribute classes in a parent-child relationship (e.g., a dimension of time may have a parent class of "year" and child classes of "month," "day," and "time"). The system 200 may access a cube of data that includes one or more dimensions that define a relationship between multiple attribute classes. The system 200 also may access multiple columns worth of data from a database table.

The system 200 may determine which data to access based on rules defined by a database architect or system administrator. For example, a database architect or system administrator may set rules defining data of interest to an organization. In this example, the rules may define which attribute classes are of interest to an organization and the system 200 accesses the data for the attribute classes of interest. The rules also may define time periods of interest to an organization and the system 200 may access data associated with the relevant time periods (e.g., data stored within the last five years).

In some implementations, the system 200 may determine which data to access dynamically based on the user or device requesting access. In these implementations, the system 200 may determine access level credentials of the user or device requesting access to the data and determine which data to access based on the determined credentials. In addition, the rules may define that different users or different types of users receive different attribute classes of data. For instance, the system 200 may access financial data for an organization when the user accessing the data is a financial analyst, but may access personnel data for the organization when the user accessing the data is a human resources manager.

In some examples, the system 200 may access data from the electronic data storage prior to receiving a report generation command such that the data is pre-loaded for execution of a report generation process. In these examples, the system 200 may access the data when a user logs onto the system 200 or when the system 200 is powered on. The system 200 also may access data at periodic intervals, such as one time each day.

The system 200 identifies redundancy characteristics of the accessed data within each of at least two attribute classes (320). The system 200 may identify a number of distinct values within each of the at least two attribute classes as the redundancy characteristics. For example, the system 200 may process the accessed data by analyzing each data value for an attribute class and counting the number of distinct values that exist for the attribute class in the stored data. In this example, the system 200 may sequentially analyze all of the records in the accessed data, track data values for the attribute class present in the data records (e.g., store analyzed values in temporary storage), and compare data values for subsequent records to the tracked values to determine whether the data values are distinct from other data values included in the data records. When a data value matches a tracked value, the system 200 determines that the data value is not distinct (e.g., determines that the data value is redundant of at least one other data value) and continues processing the next data record without updating tracked data. When a data value does not match any tracked value, the system 200 determines that the data value is distinct (e.g., determines that the data value is not redundant of at least one other data value), stores the data value with the tracked data values for comparison against subsequent records, and increments a counter that tracks the number of distinct data values within the attribute class.

In some implementations, the system 200 may sort the accessed data with respect to an attribute class of interest prior to identifying the number of distinct values within the attribute class of interest. Sorting the accessed data may improve efficiency in identifying the number of distinct values because the data records with the same data value for the attribute class would be arranged together and processed consecutively. Accordingly, because the system 200 knows the data values are arranged consecutively, the system 200 may only have to compare a data value to the most recently tracked data value. Specifically, if the data value is redundant of a previously processed data value, it is necessarily redundant of the most recently tracked data value because it would have been grouped together with the most recently tracked data value in the sorting process.

The system 200 may calculate other measures of data redundancy within an attribute class to identify redundancy characteristics. For example, the system 200 may determine a percentage, within each of the at least two of the multiple attribute classes, of the accessed data that has a redundant value for the corresponding attribute class. In this example, the system 200 may compute the percentage as the number of distinct data values over the total number of data values.

The system 200 also may determine a distribution of redundant values within an attribute class. For instance, for each distinct data value within an attribute class, the system 200 may determine the number or percentage of records that include the distinct data value. The system 200 may use the distribution of redundant values to determine the benefit of leveraging the redundancy of the data within the attribute class. For example, a first attribute class may have the same number of distinct data values as a second attribute class, but a single, distinct data value within the first attribute class may be present in a relatively high percentage of the data records while the distinct data values in the second attribute class may be more evenly distributed. In this example, the system 200 may determine characteristics of the distribution of redundant data values within the first attribute class and the second attribute class and determine a metric that corresponds to the degree with which the redundancy of the data may be leveraged in compressing the data. The metric corresponding the first attribute class may reflect a higher degree of being able to leverage redundancy of the data than the metric corresponding the second attribute class because the relatively high degree of redundancy of the single, distinct data value in the first attribute class may be leveraged more so than any of the redundant data values in the second attribute class.

In some examples, the system 200 may consider redundancy of data values within related (e.g., child) attribute classes as part of the redundancy characteristics. In these examples, data within parent and child attribute classes may need to be stored together (e.g., when the data for the parent attribute class and the child attribute class is stored in a single record) and, therefore, redundancy characteristics of the data within the child attribute class may impact the ability to leverage redundancy within the parent attribute class. The system 200 may group distinct data values in a parent attribute class together and, for each group within the parent attribute class (e.g., each block of the same data value within the parent attribute class), the system 200 may determine the number of distinct data values in a child attribute class that are associated with the corresponding group. Accordingly, rather than analyzing redundancy of the child attribute class as a whole, redundancy of the child attribute class is measured based on groups of redundant data within the parent attribute class (e.g., two of the same value in the child attribute class may be counted as distinct when the two values are associated with different groups in the parent attribute class). In this regard, the system 200 may measure a level of redundancy in a combination of the parent and child attribute classes. This may provide a measure of the ability of further leverage the redundancy of the parent attribute class within the child attribute class.

For example, a first parent attribute class may have a greater number of distinct data values than a second parent attribute class such that, taken alone, the second parent attribute class has a greater level of data redundancy than the first parent attribute class. However, in this example, the first parent attribute class may be associated with a first child attribute class that has a relatively high level of data redundancy for each group of distinct data values in the first parent attribute class when data records are grouped into blocks of distinct values in the first parent attribute class (as an extreme example, suppose the first child attribute class has a single distinct data value for each group). The second parent attribute class may be associated with a second child attribute class that has a relatively low level of data redundancy for each group of distinct data values in the second parent attribute class when data records are grouped into blocks of distinct values in the second parent attribute class (as an extreme example, suppose the second child attribute class has a distinct data value for each data record included in each group). In this example, because of the child attribute classes, the redundancy characteristics of the first attribute class may be leveraged better than the redundancy characteristics of the second attribute class, even though, taken alone, the second parent attribute class has a greater level of data redundancy than the first parent attribute class. The system 200 may identify the redundancy within the child attribute classes and track data that reflects combined redundancy as part of the identified redundancy characteristics.

The system 200 determines an order for organizing the multiple attribute classes of the accessed data based on the identified redundancy characteristics (330). For instance, when the system 200 identifies a number of distinct values within each of the multiple attribute classes, the system 200 may determine a relative order among the multiple attribute classes of the accessed data based on the identified number of distinct values within each of the multiple attribute classes. In this regard, the system 200 may determine to order the multiple attribute classes by ordering attribute classes with a lower number of distinct data values prior to attribute classes with a higher number of distinct data values. The system 200 may determine that a first attribute class has a lower number of distinct values than a second attribute class and, therefore, order the first attribute class prior to the second attribute class in the determined relative order.

In some examples, the system 200 may identify, from among the multiple attribute classes, an attribute class having a lowest number of distinct values and order the identified attribute class having the lowest number of distinct values first in the determined relative order. In these examples, the system 200 may order the remaining attribute classes by increasing number of distinct data values.

When the system 200 determines a percentage, within each of the multiple attribute classes, of the accessed data that has a redundant value for the corresponding attribute class, the system 200 may determine a relative order among the multiple attribute classes of the accessed data based on the determined percentages. For instance, the system 200 may identify the attribute class that has the highest percentage and order the identified attribute class having the highest percentage first in the determined relative order. Also, the system 200 may order the attribute classes in an order of decreasing percentages.

In some implementations, after the system 200 identifies the attribute class to order first in the determined relative order (e.g., the attribute class with the lowest number of distinct data values, the attribute class with the highest percentage of redundant data, etc.), the system 200 may reevaluate data redundancy characteristics of the remaining attribute classes based on the determination of the first attribute class. In these implementations, the data redundancy characteristics of the other attribute classes may change based on which attribute class is determined to be first in the order. For example, after identifying the first attribute class, the system 200 may organize the data and identify blocks of redundant data included in the first attribute class. In this example, the system 200 may identify data redundancy characteristics of data in the other attribute classes within the blocks of redundant data identified in the first attribute class. Because data that is otherwise redundant in the other attribute classes, may span multiple, different blocks of redundant data in the first attribute class, the system 200 may not be able to fully leverage the redundancy of the data and the redundancy characteristics may change. As such, within the other attribute classes, a second attribute class may have redundancy characteristics that reflect a higher degree of data redundancy than redundancy characteristics of a third attribute class prior to the selection of the first attribute class in the order. After selection of the first attribute class in the order, however, the second attribute class may have updated redundancy characteristics that reflect a lower degree of data redundancy than updated redundancy characteristics of the third attribute class. Specifically, the distribution of redundant data within the third attribute class may be relatively similar to the distribution of redundant data within the first attribute class and the distribution of redundant data within the second attribute class may be relatively dissimilar to the distribution of redundant data within the first attribute class. Therefore, the third attribute class may have a higher degree of data redundancy than the second attribute class when data redundancy characteristics are determined after establishing the first attribute class in the order.

The system 200 may determine updated redundancy characteristics for each of the remaining attribute classes based on the selection of the first attribute class and identify a next attribute class in the order based on the updated data redundancy characteristics. For instance, the system 200 may select the second attribute class in the order as the remaining attribute class that has updated data redundancy characteristics that reflect the highest degree of data redundancy based on selection of the first attribute class in the order. After selection of each attribute class in the order, the system 200 may continue to update data redundancy characteristics for the remaining attribute classes and identify the next attribute class as the attribute class having updated data redundancy characteristics that reflect the highest degree of data redundancy in light of the prior selections.

Figure 4:
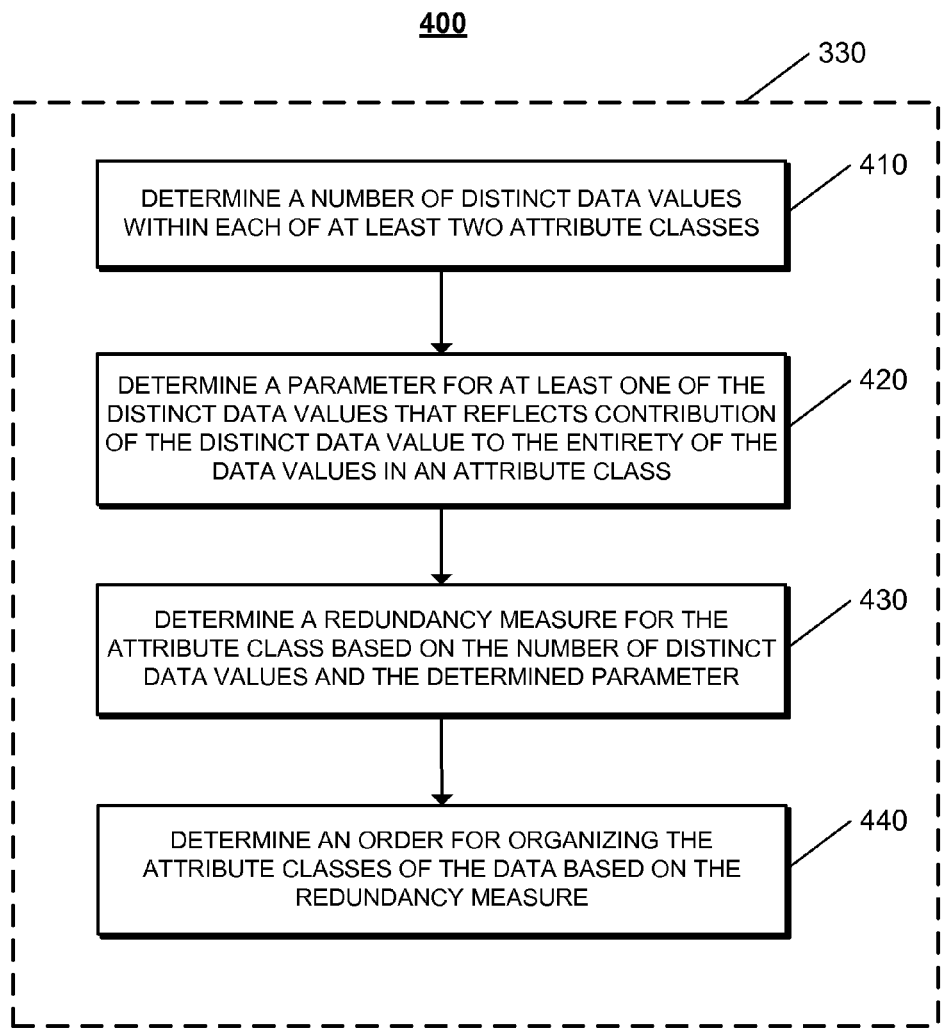

FIG. 4 illustrates a process 400 for determining an order for organizing multiple attribute classes of data based on identified redundancy characteristics. The process 400 may used in determining an order for organizing multiple attribute classes of data based on identified redundancy characteristics referenced above with respect to reference numeral 330. The operations of the process 400 are described generally as being performed by the system 200. The operations of the process 400 may be performed exclusively by the data processing system 205, may be performed exclusively by the database system 280, or may be performed by a combination of the data processing system 205 and the database system 280. In some implementations, operations of the process 400 may be performed by one or more processors included in one or more electronic devices.

The system 200 determines a number of distinct data values within each of at least two attribute classes (410). For example, the system 200 may process data within each of at least two attribute classes by analyzing each data value for an attribute class and counting the number of distinct values that exist for the attribute class in the data. In this example, the system 200 may sequentially analyze all of the records in the data, track data values for the attribute class present in the data records (e.g., store analyzed values in temporary storage), and compare data values for subsequent records to the tracked values to determine whether the data values are distinct from other data values included in the data records. When a data value matches a tracked value, the system 200 determines that the data value is not distinct (e.g., determines that the data value is redundant of at least one other data value) and continues processing the next data record without updating tracked data. When a data value does not match any tracked value, the system 200 determines that the data value is distinct (e.g., determines that the data value is not redundant of at least one other data value), stores the data value with the tracked data values for comparison against subsequent records, and increments a counter that tracks the number of distinct data values within the attribute class.

In some implementations, the system 200 may sort the data with respect to an attribute class of interest prior to identifying the number of distinct values within the attribute class of interest. Sorting the accessed data may improve efficiency in identifying the number of distinct values because the data records with the same data value for the attribute class would be arranged together and processed consecutively. Accordingly, because the system 200 knows the data values are arranged consecutively, the system 200 may only have to compare a data value to the most recently tracked data value. Specifically, if the data value is redundant of a previously processed data value, it is necessarily redundant of the most recently tracked data value because it would have been grouped together with the most recently tracked data value in the sorting process.

The system 200 determines a parameter for at least one of the distinct data values that reflects contribution of the distinct data value to the entirety of the data values in an attribute class (420). For a particular distinct data value, the system 200 may determine a parameter that indicates the number of times that the particular distinct data value is found within the data records or may determine a parameter that indicates the percentage of the data records in which the particular distinct data value is found. The system 200 also may determine a rate of occurrence of the distinct data value within the entirety of data values within the attribute class. The system 200 may determine a parameter that reflects contribution of the distinct data value to the entirety of the data values in an attribute class for each of the distinct data values in the attribute classes (e.g., each distinct value is associated with a parameter). Using the parameters, the system 200 may determine a distribution of redundant data within an attribute class.

The system 200 determines a redundancy measure for the attribute class based on the number of distinct data values and the determined parameter (430). The system 200 may apply the number of distinct data values and the determined parameter to a formula that computes the redundancy measure. For instance, the system 200 may use the determined parameter as a weighting value in evaluating the number of distinct data values. The system 200 may apply a weighting value that increases a measured level of data redundancy when the parameter reflects a relatively high contribution of a redundant data value to the entirety of the data values in an attribute class. The system 200 also may apply a weighting value that decreases a measured level of data redundancy when the parameter reflects a relatively low contribution of a redundant data value to the entirety of the data values in an attribute class. In some examples, the system 200 may determine a redundancy measure that reflects a relatively higher level of data redundancy when the parameter reflects a relatively higher contribution of the distinct data value to the entirety of the data values in the attribute class. In these examples, the system 200 may determine a redundancy measure that reflects a relatively lower level of data redundancy when the parameter reflects a relatively lower contribution of the distinct data value to the entirety of the data values in the attribute class. By using the parameter, the system 200 may account for the ability of the system 200 to leverage redundancy within the data, rather than just the number of distinct data values.

The system 200 determines an order for organizing the attribute classes of the data based on the redundancy measure (440). For example, the system 500 may compare determined redundancy measures for each of the attribute classes and determine an order in which to organize the attribute classes based on the comparison. In this example, the system 200 may select the attribute class with a redundancy measure that reflects an ability to leverage data redundancy to a highest degree as the first attribute class in the order. The system 200 may order the remaining attribute classes in an order of redundancy measures that reflect a decreasing ability to leverage data redundancy, perhaps computing new redundancy measures after selecting an attribute class in the order.

In some examples, the system 200 may determine that a first attribute class has a first number of distinct data values and a first parameter for a first distinct data value. The first parameter for the first distinct data value may reflect a relatively high contribution of the first distinct data value to the entirety of data values within the first attribute class (e.g., the parameter may reflect a ninety percent contribution of the first distinct data value). The system 200 also may determine that a second attribute class has a second number of distinct data values and a second parameter for a second distinct data value. In these examples, the second number of distinct data values within the second attribute class is lower than the first number of distinct data values within the first attribute class and the second parameter for the second distinct data value may reflect a relatively low contribution of the second distinct data value to the entirety of data values within the second attribute class (e.g., the parameter may reflect a five percent contribution of the second distinct data value). The system 200 may determine a first redundancy measure for the first attribute class and a second redundancy measure for the second attribute class. Because the first parameter reflects a relatively high contribution of the first distinct data value to the entirety of data values within the first attribute class and the second parameter for the second distinct data value reflects a relatively low contribution of the second distinct data value to the entirety of data values within the second attribute class, the second redundancy measure may reflect a lower level of redundancy for the second attribute class than the first redundancy measure reflects for the first attribute class despite the second number of distinct data values within the second attribute class being lower than the first number of distinct data values within the first attribute class. The system 200 may order the first attribute class prior to the second attribute class in the determined relative order based on the second redundancy measure reflecting a lower level of redundancy for the second attribute class than the first redundancy measure reflects for the first attribute class. Ordering the first attribute class prior to the second attribute class may enable the system 200 to leverage redundancy of data better than if the second attribute class was ordered prior to the first attribute class because of the relatively high contribution of the first distinct data value to the first attribute class, even though the second attribute class has fewer distinct data values.

Figure 5:
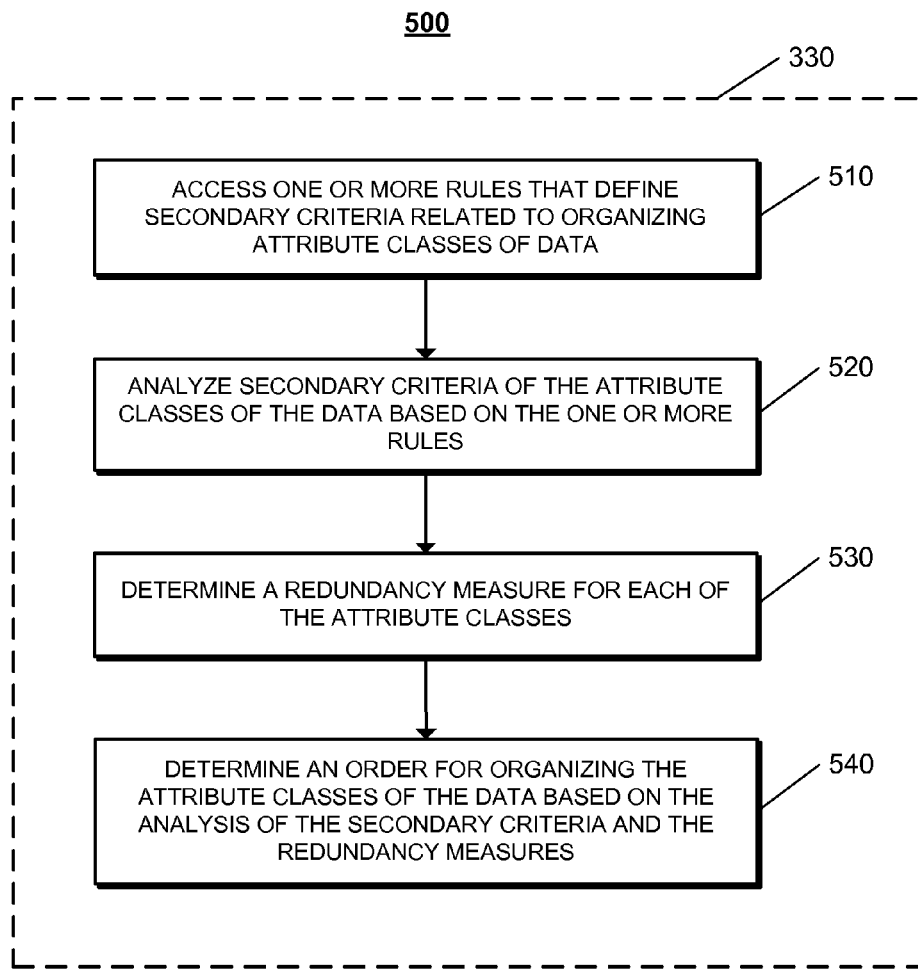

FIG. 5 illustrates a process 500 for determining an order for organizing multiple attribute classes of data based on identified redundancy characteristics. The process 500 may used in determining an order for organizing multiple attribute classes of data based on identified redundancy characteristics referenced above with respect to reference numeral 330. The operations of the process 500 are described generally as being performed by the system 200. The operations of the process 500 may be performed exclusively by the data processing system 205, may be performed exclusively by the database system 280, or may be performed by a combination of the data processing system 205 and the database system 280. In some implementations, operations of the process 500 may be performed by one or more processors included in one or more electronic devices.

The system 200 accesses one or more rules that define secondary criteria related to organizing attribute classes of data (510). For example, the system 200 may access, from electronic storage, rules that define organization of attribute classes of data. The rules may define relationships of attribute classes that are to be maintained when determining an order for the attribute classes and may define preferences, which are unrelated to redundancy of data, that impact ordering of attribute classes. The rules also may define thresholds related to data redundancy that are used in determining whether to reorder or reorganize attribute classes within a set of data. The rules may be general rules that are applied generally to any operation to determine an order for organizing multiple attribute classes of data or may be specific to a specific set of data or one or more specific attribute classes. The rules may be routinely used in determining an order for attribute classes or may be used in determining an order for attribute classes to break a tie in redundancy measures or when redundancy analysis of the data within the attribute classes is inconclusive.

In some implementations, the system 200 may access a rule that indicates a preference to maintain an order of attribute classes within a dimension of attribute classes despite redundancy characteristics. A dimension of attribute classes may define a subset of multiple attribute classes that have a parent-child relationship (e.g., a dimension of time may have a parent class of "year" and child classes of "month," "day," and "hour"). The rule may prevent attribute classes within a dimension from being reordered. For example, in the dimension of time, the rule may prevent the system 200 from ordering the attribute class "day" prior to the attribute class "year," even when redundancy characteristics of data values in the "year" and "day" attribute classes indicate that the "day" attribute class has a higher degree of data redundancy than the "year" attribute class.

The rule also may allow reordering of attribute classes within a dimension, but require a relatively high difference in data redundancy to do so. For instance, in the dimension of time, the rule may require the system 200 to determine that redundancy measures for the "year" and "day" attribute classes have at least a first threshold difference to enable the system 200 to order the attribute class "day" prior to the attribute class "year." The first threshold difference may be greater than a second threshold difference used by the system 200 in determining whether to reorder attribute classes that are not part of the same dimension. In some examples, the system 200 may access a rule that defines multiple thresholds for determining whether to reorder attribute classes within a dimension, where the multiple thresholds are based on relative position of attribute classes within the dimension. In these examples, threshold differences may increases as the relative distance between attribute classes within the dimension increases. For the time dimension, a first threshold difference may be required to reorder the attribute class "month" prior to the attribute class "year" and a second threshold difference that is greater than the first threshold difference may be required to reorder the attribute class "hour" prior to the attribute class "year."

In some implementations, the system 200 may access a rule that indicates other characteristics to consider in ordering attribute classes. For instance, the system 200 may access a rule that indicates that a relatively frequently searched attribute class is prioritized in comparison to a relatively infrequently searched attribute class in determining an order of attribute classes. The rule may prevent the system 200 from ordering a relatively frequently searched attribute class prior to a relatively infrequently searched attribute class when the difference in the amount with which the relatively frequently searched attribute class and the relatively infrequently searched attribute class exceeds a threshold. In this regard, when a particular attribute class is often searched, the system 200 may ensure that redundancy of the particular attribute class is leveraged. Although redundancy of another attribute class that is infrequently searched may be leveraged to a greater degree (e.g., a higher level of compression), because the other attribute class is not searched often, the benefit of leveraging the redundancy is relatively low as compared to the benefit leveraging the redundancy of the particular attribute class. Specifically, the aggregated benefit of leveraging the redundancy of the particular attribute class over many searches may be greater than the aggregated benefit of leveraging the redundancy of the other attribute class over few searches, even though the benefit of a single instance is greater for the other attribute class.

The system 200 also may access a rule that defines a threshold difference in redundancy measures to use in ordering attribute classes based on other characteristics. For example, the system 200 may determine a threshold difference that varies based on how frequently two attribute classes are searched. In this example, when a relatively frequently searched attribute class is being compared to a relatively infrequently searched attribute class, the rule may require a first threshold difference in redundancy measures in order to order the relatively infrequently searched attribute class prior to the relatively frequently searched attribute class. When a first relatively frequently searched attribute class is being compared to a second relatively frequently searched attribute class, the rule may require a second threshold difference in redundancy measures that is less than the first threshold difference in order to order the second relatively frequently searched attribute class prior to the first relatively frequently searched attribute class.

The system 200 analyzes secondary criteria of the attribute classes of the data based on the one or more rules (520). For instance, the system 200 may identify second criteria of the attribute classes being considered and compare the identified secondary criteria to the one or more rules. Based on the comparison, the system 200 may evaluate the secondary criteria and update a weighting value or measure that is used in ordering the attribute classes. The system 200 also may store data that is later used in ordering the attribute classes and that defines relationships between the attribute classes based on the evaluation of the secondary criteria.

When the rule is related to handling a dimension of attribute classes, the system 200 may identify a dimension of attribute classes included in the multiple attribute classes. The system 200 may identify one or more dimensions of attribute classes based on the attribute classes being arranged in a particular order in the electronic data storage based on a parent-child relationship. The system 200 may identify one or more dimensions of attribute classes within the attribute classes under consideration (e.g., which attribute classes are in which dimensions) and also may identify relative positions of attribute classes within each of the identified dimensions. Based on the identified dimensions and the identified relative positions of attribute classes within each of the identified dimensions, the system 200 may apply the rule related to handling a dimension of attribute classes to the attribute classes under consideration.

When the rule is related to other characteristics to consider in ordering attribute classes, the system 200 may identify other characteristics for the multiple attribute classes. For example, when the other characteristics relate to how frequently the attribute classes are searched, the system 200 may access data related to how frequently the attribute classes are searched. In this example, the system 200 may track searches over time and store data that reflects how frequently each of the attribute classes are searched. The system 200 may store data tracking the number of times an attribute class is searched for a given period of time and compute a frequency with which the attribute class is searched by dividing the number of times by the given period of time. Using the frequency of how often each of the attribute classes is searched, the system 200 may identify relatively frequently searched attribute classes and relatively infrequently searched attribute classes and evaluate the frequency with which the attribute classes are searched with respect to the rule.

The system 200 determines a redundancy measure for each of the attribute classes (530). The system 200 may determine a redundancy measure for each of the attribute classes using any of the techniques described through the disclosure for evaluating redundancy of data within an attribute class.

The system 200 determines an order for organizing the attribute classes of the data based on the analysis of the secondary criteria and the redundancy measures (540). The system 200 may determine an order that accounts for the redundancy measures, but also complies with the one or more rules. For instance, the system 200 may set thresholds to use in evaluating redundancy measures based on the analysis of the one or more rules and then determine an order for the multiple attribute classes by evaluating the redundancy measures with respect to the set thresholds.

When the rule is related to handling a dimension of attribute classes, the system 200 may maintain the particular order of the attribute classes included in the dimension despite the identified redundancy characteristics indicating that a different order of the attribute classes included in the dimension is preferred. For instance, the rule may prevent the system 200 from reordering attribute classes within a dimension and the system 200 may maintain the particular order of the attribute classes included in the dimension to comply with the rule. In another example, the rule may allow the system 200 to reorder attribute classes within a dimension, but require a higher threshold difference in redundancy to do so. In this example, the system 200 may compute a difference in redundancy measures between a first attribute class and a second attribute class within a dimension, determine that the difference in redundancy measures is less than the threshold difference, and order the first attribute class prior to the second attribute class, even though the redundancy measure of the second attribute class indicates that the second attribute class has a higher degree of redundancy than the first attribute class.

When the rule is related to how frequently the attribute classes are searched, the system 200 may order the attribute classes based on how frequently the attribute classes are searched. For instance, based on an identification of a first attribute class as a relatively frequently searched attribute class and a second attribute class as a relatively infrequently searched attribute class, the system 200 may determine to order the first attribute class prior to the second attribute class despite the identified redundancy characteristics indicating that ordering the second attribute class prior to the first attribute class is preferred. The rule may prevent the system 200 from ordering a first attribute class prior to a second attribute class when a difference in search frequencies of the first and second attribute classes exceeds a threshold. The system 500 may compute a difference between a first search frequency for a first attribute class and a second search frequency for a second attribute class, determine that the difference in search frequencies exceeds the threshold, and order the first attribute class prior to the second attribute class, even though the redundancy measure of the second attribute class indicates that the second attribute class has a higher degree of redundancy than the first attribute class.

In another example, the rule may require a higher threshold difference in redundancy to order a relatively infrequently search attribute class prior to a relatively frequently search attribute class. In this example, the system 200 may compute a difference in redundancy measures between a first attribute class that is relatively frequently searched and a second attribute class that is relatively infrequently searched, determine that the difference in redundancy measures is less than the threshold difference, and order the first attribute class prior to the second attribute class, even though the redundancy measure of the second attribute class indicates that the second attribute class has a higher degree of redundancy than the first attribute class.

Referring again to FIG. 3, the system 200 organizes the attribute classes of the accessed data based on the determined order (340). For instance, the system 200 arranges the data in a manner that reflects the determined order of the attribute classes. The system 200 may rearrange the data accessed from the electronic data storage and thereby reorder the attribute classes. When the data accessed from the electronic data storage is part of a database table with rows and columns, the system 200 may reorder the columns within the database table. In organizing the attribute classes of the accessed data based on the determined order, the system 200 may physically rearrange the accessed data into different storage locations based on the determined order. The system 200 also may leave the accessed data in the same storage locations, but update a data structure that logically represents an order of the accessed data to reflect the determined order. For example, the system 200 may use a database table index that defines an order of columns of data within the database table and maps the columns of data to physical storage locations. In this example, the system 200 may update the database table index to reflect a new order for the columns in the database table while maintaining the mappings of the columns of data to physical storage locations.

In some examples, the system 200 may modify or change the order of the attribute classes in which the data is organized in the electronic data storage. When the multiple attribute classes of the accessed data are organized in the electronic data storage in a first order, the system 200 may reorganize the multiple attribute classes of the accessed data in a second order that is different than the first order in which the multiple attribute classes of the accessed data are organized in the electronic data storage.

The system 200 also may reorganize the attribute classes in a manner that is different from the dimensional relationships by which the attribute classes are organized in the electronic data storage. For example, the multiple attribute classes may include at least a first dimension of attribute classes and a second dimension of attribute classes. In this example, each of the first and second dimensions define an exclusive subset of the multiple attribute classes that are related. The multiple attribute classes of the accessed data further may be organized in the electronic data storage in a first order that is based on the first and second dimensions such that the exclusive subset of attribute classes included in the first dimension are ordered consecutively and the exclusive subset of attribute classes included in the second dimension are ordered consecutively. In this example, the system 200 may reorganize the multiple attribute classes of the accessed data in a second order in which at least one attribute class included in the first dimension is ordered among the attribute classes included in the second dimension such that the exclusive subset of attribute classes included in the first dimension are no longer ordered consecutively and the exclusive subset of attribute classes included in the second dimension are no longer ordered consecutively.

To illustrate, suppose the accessed data includes a time dimension with the attribute classes "year," "month," "day," and "hour," and also includes a location dimension that includes the attribute classes "state," "city," and "street address." The accessed data may be stored in a database table with a column corresponding to each of the attribute classes. The columns may be arranged in an order "year," "month," "day," "hour," "state," "city," and "street address." After determining an order of the attribute classes based on identified redundancy characteristics, the system 200 may determine that the shown order does not best leverage redundancy within the data and a different order that disrupts the dimensional arrangement is preferred. For instance, the system 200 may determine that an order of "year," "state," "city," "month," "day," "hour," and "street address" best leverages redundancy within the accessed data and reorder the attribute classes in this order. In this case, the system 200 has interspersed attribute classes from a first dimension within attribute classes of a second dimension, but maintained the relative order of attribute classes within each of the respective dimensions (i.e., if the attribute classes from the first dimension are removed, the attribute classes from the second dimension remain in the same order as prior to reordering the attribute classes).

In some examples, the system 200 may reorder the attribute classes without regard for dimension relationships. In this regard, the system 200 may reorder attribute classes within a dimension in an order that is different than the order defined by the dimension. For instance, the multiple attribute classes may include a dimension of attribute classes that defines a subset of the multiple attribute classes that have a parent-child relationship and the multiple attribute classes of the accessed data may be organized in the electronic data storage in a first order that is based on the dimension such that parent attribute classes are ordered prior to child attribute classes in the electronic data storage. The system 200 may reorganize the subset of the multiple attribute classes included in the dimension in a second order in which at least one child attribute class is ordered prior to at least one of its parent attribute classes as defined by the parent-child relationship.

To illustrate, suppose the accessed data includes a time dimension with the attribute classes "year," "month," "day," and "hour." The accessed data may be stored in a database table with a column corresponding to each of the attribute classes. The columns may be arranged in an order "year," "month," "day," and "hour." After determining an order of the attribute classes based on identified redundancy characteristics, the system 200 may determine that the shown order does not best leverage redundancy within the data and a different order that disrupts an order of the time dimension is preferred. For instance, the system 200 may determine that an order of "month," "year," "day," and "hour" best leverages redundancy within the accessed data and reorder the attribute classes in this order, even though the order defined by the time dimension is changed. This type of change may occur when the data spans a relatively large number of years, but with events occurring in a relatively low number of months. For example, tax return filing data may include filings that span many years (e.g., a period of 20 years), but with the filings typically occurring in a low number of months or occurring with a relatively high frequency in a single month (e.g., April).

The system 200 compresses the data within the organized attribute classes using run length encoding (350). Run length encoding is a form of lossless data compression in which runs of data (e.g., sequences in which the same data value occurs in many consecutive data elements) are stored as a single data value and count, rather than as a series of repeated values. Run length encoding may provide a significant level of compression when the data has a large amount of redundancy and a data value for many records may be expressed as a single value and range, instead of storing the value for each record. In other implementations, other forms of compression (or no compression) may be used.

In some implementations, after the attribute classes of the accessed data have been organized, the system 200 may sort the data to group the same values within the first attribute class together. The system 200 then may store each group of the same value as a single block of data within the first attribute class. Each block may include data that defines the value associated with the block and data that defines the records (e.g., rows) associated with the block. Because the block does not redundantly store the value for each record (e.g., row), the data may be compressed and the storage capacity needed to store the data may be reduced.

After storing the data within the first attribute class as compressed blocks, the system 200 may compress data values within each block for the second attribute class in the determined order. The system 200 may sort the data values to group the same value for the second attribute class within a block together and then store the grouped values as compressed blocks. Because the first attribute class has been compressed into blocks when the system 200 evaluates the second attribute class, the structure of the data with respect to the first attribute class has been set and, therefore, the system 200 cannot reorder or rearrange records (e.g., rows) within a first block of the first attribute class to a second block of the first attribute class. Accordingly, even though two records (e.g., rows) may have a redundant value for the second attribute class, the system 200 may not be able to take advantage of that redundancy and compress the two values into a single block of common values, unless the records (e.g., rows) are arranged in the same block in the first attribute class. The system 200 may continue to process blocks within each attribute class until all of the attribute classes have been processed or until an attribute class does not include any compressed blocks of data that span multiple records (e.g., rows).

In some implementations, the system 200 may load a portion of the data from the electronic data storage and process the portion of the data as described above. After compressing the portion of the data, the system 200 may determine how much storage space is needed to store the compressed data and how much storage space the system 200 has in which to store data (e.g., a size of a memory). The system 200 may compare the two values and determine whether additional data may be accessed and loaded into memory. For instance, when the data is highly redundant and a large amount of compression occurs, the system 200 may determine that a relatively large amount of storage space remains. When a relatively large amount of storage space remains, the system 200 may load more data from the electronic data storage (e.g., database) to take advantage of the additional storage space gained through data compression.

FIG. 6 illustrates an example data structure as the data within the data structure is organized by attribute classes and compressed using run length encoding. As shown, the data structure 610 illustrates how the data in this example is stored in the electronic data storage. The data structure 610 includes a month column 611 that stores a month value associated with a record, a year column 612 that stores a year value associated with a record, a state column 613 that stores a state value associated with a record, a city column 614 that stores a city value associated with a record, and a sales metric column 615 that stores a sales metric associated with a record. The data structure 610 stores the data with the attribute classes in the order 611, 612, 613, 614, and 615. The data structure 610 also includes data records 621 to 627 that each include data associated with a stored record.

The system 200 first processes the data structure 610 to identify redundancy characteristics of the data within the data structure 610. For example, the system 200 may count the number of distinct data values in each attribute class. In this example, the system 200 determines that the year column 612 has two distinct values, the month column 611 has three distinct values, the state column 613 has three distinct values, the city column 614 has four distinct values, and the sales metric column 612 has seven distinct values. Because the year column 612 has the fewest number of distinct data values, the system 200 determines to order the year column 612 first.

In response to the determination to order the year column 612 first, the system 200 identifies redundancy characteristics of the other columns with respect to blocks of data within the year column 612. Because the year column 612 has two distinct data values, two blocks of data exist: the "06" block and the "07" block. In identifying redundancy characteristics of the other columns within the blocks of the year column 612, the system 200 determines that the month column 611 has two distinct values in the "06" block and one distinct data value in the "07" block for a total of three distinct data values, the state column 613 has two distinct values in the "06" block and three distinct data values in the "07" block for a total of five distinct data values, the city column 614 has three distinct values in the "06" block and three distinct data values in the "07" block for a total of six distinct data values, and the sales metric column 615 has four distinct values in the "06" block and three distinct data values in the "07" block for a total of seven distinct data values. Because the month column 611 has the fewest number of distinct data values with respect to blocks of data within the year column 612, the system 200 determines to order the month column 611 second in the attribute classes.

In response to the determination to order the month column 611 second, the system 200 identifies redundancy characteristics of the remaining columns with respect to blocks of data within the month column 611. Because the month column 611 has three distinct data values with respect to blocks of data within the year column 612, three blocks of data exist: the "06/01" block, the "06/02" block, and the "07/01" block. In identifying redundancy characteristics of the remaining columns within the blocks of the month column 611, the system 200 determines that the state column 613 has one distinct value in the "06/01" block, two distinct values in the "06/02" block and three distinct values in the "07/01" block for a total of six distinct data values, the city column 614 has one distinct value in the "06/01" block, three distinct values in the "06/02" block and three distinct values in the "07/01" block for a total of seven distinct data values, and the sales metric column 615 has one distinct value in the "06/01" block, three distinct values in the "06/02" block and three distinct values in the "07/01" block for a total of seven distinct data values. Because the state column 612 has the fewest number of distinct data values with respect to blocks of data within the month column 611, the system 200 determines to order the state column 612 next (e.g., third) in the attribute classes.

In addition, because the city column 614 and the sales metric column 615 both have seven distinct data values with respect to blocks of data within the month column 611 and only seven records exist in the accessed data, the system 200 determines that no additional data redundancy exists in those columns. Based on the determination that no additional data redundancy exists in the remaining columns, the system 200 maintains the order of the remaining columns in the determined order. In some implementations, the system 200 may have determined that the sales metric column 615 had no data redundancy (e.g., seven distinct data values) when identifying the first column and, therefore, set the sales metric column 615 last in the determined order and stopped processing the sales metric column 615 in determining the order. In other implementations, because the sales metric column 615 includes sales metric data that is the subject of a report being generated using the accessed data, the sales metric column 615 may not be considered in ordering the attribute classes and only considered when computing the relevant values in generating a report.

Accordingly, the system 200 determines the final order for the attribute classes as columns 612, 611, 613, 614, and 615 based on the identified redundancy characteristics. Using the determined order, the system 200 reorganizes the attribute classes in the data structure 610 as shown in the data structure 630. In addition, the system 200 has sorted the data in the data structure 630 into groups of data records having the same value. After the first column (i.e., the year column 612), the system 200 sorted the data within blocks included in the immediately preceding column in the determined order.

After the data has been organized and sorted, the system 200 compresses the data into blocks using run length encoding. The data structure 640 illustrates the results of the compression using run length encoding. As shown, the data structure 640 includes a block 641 that represents the "06" data value in the year column 612 and a block 642 that represents the "07" data value in the year column 612. The data structure 640 also includes a block 643 that represents the "06/01" data value in the month column 611 for the block 641, a block 644 that represents the "06/02" data value in the month column 611 for the block 641, and a block 645 that represents the "07/01" data value in the month column 611 for the block 642. The data structure 640 further includes a block 646 that represents the "VA" data value in the state column 613 for the block 643. As such, the data structure 640 represents an example of data after the data has been reorganized and compressed into blocks using run length encoding.

Referring again to FIG. 3, the system 200 generates an index that is descriptive of the compressed data (360). The system 200 may analyze the compressed data and generate a data structure that defines the organization of the data. For instance, when the data is organized and compressed into blocks, the index may identify blocks within the organized data and identify relationships between the blocks in the organized data. The relationships may indicate whether blocks are within the same attribute class and whether a particular block is related to other blocks within other attribute classes (e.g., whether the block has a parent block associated with a parent attribute class and/or whether the block has a child block associated with a child attribute class). The system 200 may generate the index by identifying the blocks within the organized and compressed data, determining relationships between the identified blocks, and generating data that is descriptive of the identified blocks and determined relationships. The system 200 also may identify storage locations of data records associated with the identified blocks and store addressing information (e.g., row numbers) for each of the identified blocks that map the identified blocks to stored records. The addressing information may enable future accesses of data stored within records associated with the identified blocks by referencing the index.

In some implementations, the system 200 may generate the index by identifying blocks within the compressed data that have common values and identifying storage locations of the identified blocks within the compressed data. The system 200 may associate, within the index, the identified blocks within the compressed data with the corresponding common values and the identified storage locations. By associating an identified block within the compressed data with the corresponding common value and the identified storage locations, the system 200 may be able to group data having the common value and identify storage locations associated with records having the common value relatively quickly using the index.

Figure 7:
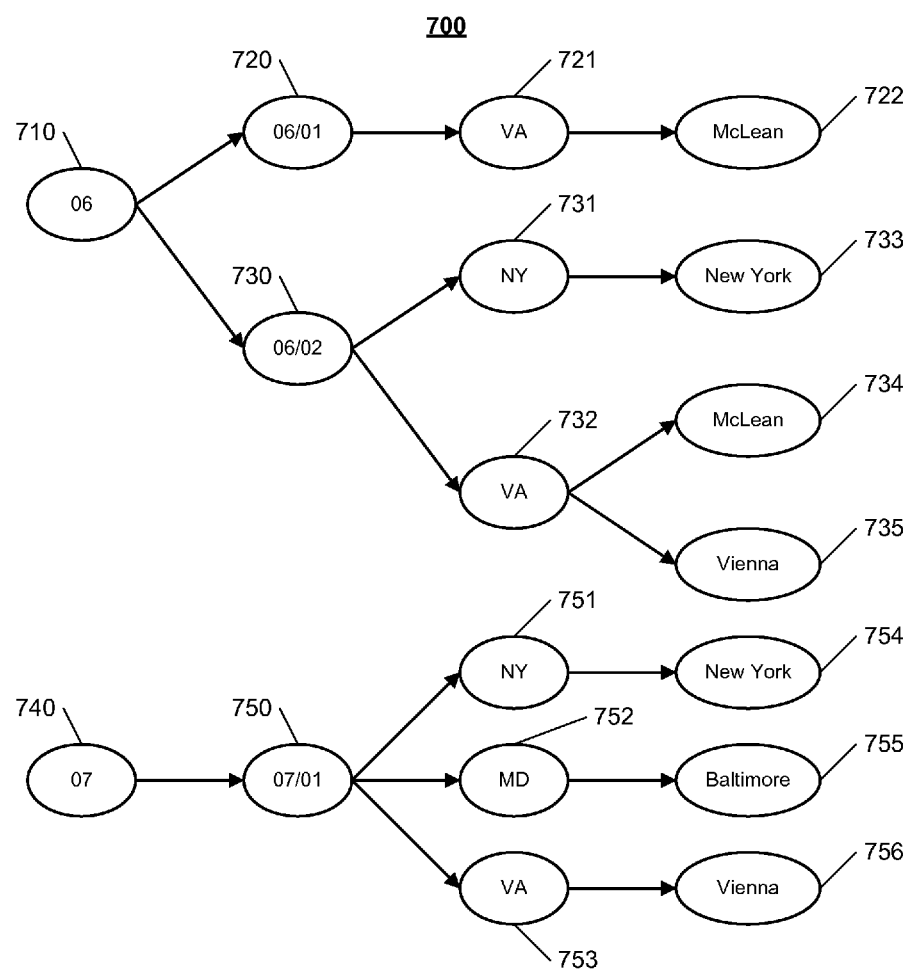
Figure 8:
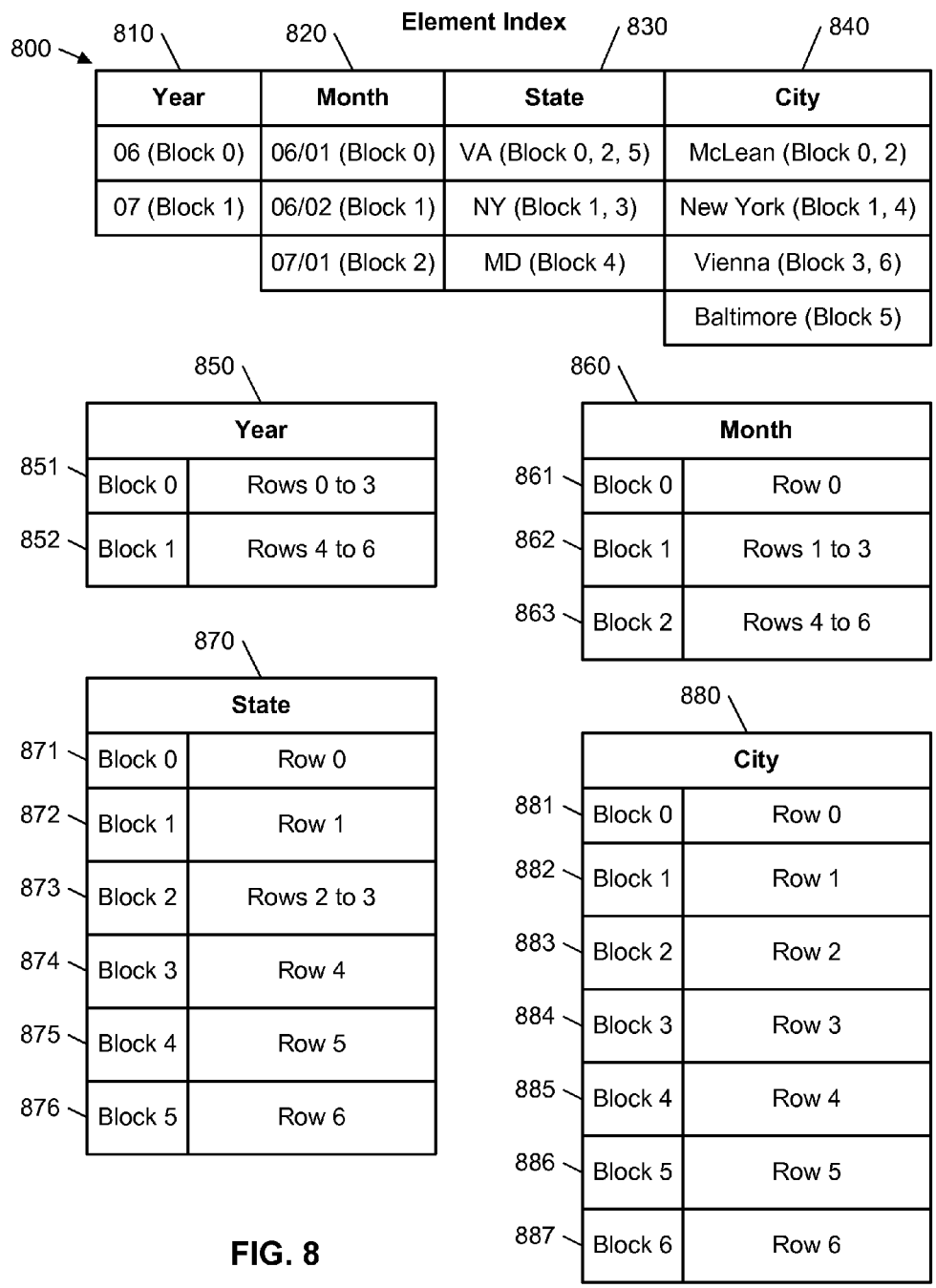

FIGS. 7 and 8 illustrate example data structures of an index that is descriptive of the compressed data shown in FIG. 6. FIG. 7 illustrates a graph structure 700 in which each block in the compressed data is represented by a node and the arrows between the nodes represent relationships between the blocks within the compressed data. As shown, the node 710 corresponds to the "06" block in the year column 612 (e.g., the block 641). The node 710 is connected to the nodes 720 and 730 because the nodes 720 and 730 are immediate child nodes or blocks associated with the node 710. The node 720 corresponds to the "06/01" block (e.g., the block 643) in the month column 611 for the "06" block in the year column 612, and the node 730 corresponds to the "06/02" block (e.g., the block 644) in the month column 611 for the "06" block in the year column 612. The node 720 has one immediate child node 721 for the "VA" data value in the state column 613 and the node 721 has one immediate child node 722 for the "McLean" data value in the city column 614. The node 730 has a first immediate child node 731 for the "NY" data value in the state column 613 and a second immediate child node 732 for the "VA" data value in the state column 613 (e.g., the block 646). The node 731 has one immediate child node 733 for the "New York" data value in the city column 614. The node 732 has a first immediate child node 734 for the "McLean" data value in the city column 614 and a second immediate child node 735 for the "Vienna" data value in the city column 614.

The node 740 corresponds to the "07" block in the year column 612 (e.g., the block 642) and shows relationships of the blocks in the data associated with records having "07" as the year value. The node 740 is connected to the node 750 because the node 750 is an immediate child node or block associated with the node 740. The node 750 corresponds to the "07/01" block (e.g., the block 645) in the month column 611 for the "07" block in the year column 612. The node 750 has a first immediate child node 751 for the "NY" data value in the state column 613, a second immediate child node 752 for the "MD" data value in the state column 613, and a third immediate child node 753 for the "VA" data value in the state column 613. The node 751 has one immediate child node 754 for the "New York" data value in the city column 614, the node 752 has one immediate child node 755 for the "Baltimore" data value in the city column 614, and the node 753 has one immediate child node 756 for the "Vienna" data value in the city column 614.

FIG. 8 illustrates an element index 800. The element index 800 includes a column for each of the attribute classes in the accessed data. For instance, the element index 800 includes a year column 810, a month column 820, a state column 830, and a city column 840. The attribute classes in the element index 800 are arranged in the order of the attribute classes after the attribute classes have been ordered based on identified redundancy characteristics. For each attribute class, the element index 800 includes one entry for each distinct data value within the corresponding attribute class. For each distinct data value, the element index 800 includes the distinct data value and block identification data that identifies which one or more blocks within the attribute class have the corresponding data value.

The element index 800 also is associated with tables that correspond to attribute classes included in the accessed data. The tables store a block identifier for each block included in an attribute class and store location information for data records that are included in the corresponding block. The location information enables the system 200 to identify and access data records that are included in a block relatively quickly. As shown, the table 850 corresponds the year attribute class. The table 850 includes an entry 851 corresponding to the first block (e.g., Block 0) in the year attribute class and entry 852 corresponding to the second block (e.g., Block 1) in the year attribute class. The entries 851-852 define which rows in a database table correspond to the block identified in the corresponding entry and the table 850 includes data associating each row in the database with a block.

The table 860 corresponds the month attribute class. The table 860 includes an entry 861 corresponding to the first block (e.g., Block 0) in the month attribute class, an entry 862 corresponding to the second block (e.g., Block 1) in the month attribute class, and an entry 863 corresponding to the third block (e.g., Block 2) in the month attribute class. The entries 861-863 define which rows in a database table correspond to the block identified in the corresponding entry and the table 860 includes data associating each row in the database with a block.

The table 870 corresponds the state attribute class. The table 870 includes an entry 871 corresponding to the first block (e.g., Block 0) in the state attribute class, an entry 872 corresponding to the second block (e.g., Block 1) in the state attribute class, an entry 873 corresponding to the third block (e.g., Block 2) in the state attribute class, an entry 874 corresponding to the fourth block (e.g., Block 3) in the state attribute class, an entry 875 corresponding to the fifth block (e.g., Block 4) in the state attribute class, and an entry 876 corresponding to the sixth block (e.g., Block 5) in the state attribute class. The entries 871-876 define which rows in a database table correspond to the block identified in the corresponding entry and the table 870 includes data associating each row in the database with a block.

The table 880 corresponds the city attribute class. The table 880 includes an entry 881 corresponding to the first block (e.g., Block 0) in the city attribute class, an entry 882 corresponding to the second block (e.g., Block 1) in the city attribute class, an entry 883 corresponding to the third block (e.g., Block 2) in the city attribute class, an entry 884 corresponding to the fourth block (e.g., Block 3) in the city attribute class, an entry 885 corresponding to the fifth block (e.g., Block 4) in the city attribute class, an entry 886 corresponding to the sixth block (e.g., Block 5) in the city attribute class, and an entry 887 corresponding to the seventh block (e.g., Block 6) in the city attribute class. The entries 881-887 define which rows in a database table correspond to the block identified in the corresponding entry and the table 880 includes data associating each row in the database with a block.

The system 200 may use the element index 800 to identify rows in the database that have a particular data value for a particular attribute class. For instance, the system 200 may compare the particular data value for the particular attribute class to the element index 800 to identify with which one or more blocks the particular data value is associated. Once the system 200 has identified the one or more blocks associated with the particular data value, the system 200 may access the table corresponding to the particular attribute class, use the identified one or more blocks as identifiers to locate relevant entries within the accessed table, and access the storage location information (e.g., row numbers) included in the located entries. The system 200 may use the storage location information to access data records that have the particular data value for the particular attribute class. Because the system 200 uses the linked addressing in the element index 800 to identify the relevant data records, the speed of identifying and accessing the relevant data records may be faster than a system that directly searches the database table to identify records that have the particular data value for the particular attribute class.

To illustrate, suppose the system 200 is searching for data records that have a value "NY" for the state attribute class. The system 200 accesses the element index 800, compares the value "NY" to values in the state column 830, and, based on the comparison, determines that the value "NY" corresponds to blocks 1 and 3 in the state attribute class. Based on the identification of blocks 1 and 3, the system 200 accesses the table 870 and identifies the storage location information correspond to blocks 1 and 3 as rows 1 and 4. Accordingly, the system 200 identified all of the rows in the database table that correspond to the value "NY" in the state attribute class without having to directly search records in the database table.

Referring again to FIG. 3, the system 200 stores, in electronic storage, the compressed data and the generated index to enable subsequent searching of the compressed data using the generated index (370). For instance, the system 200 may store the compressed data and the generated index in the memory 260. By storing the compressed data and the generated index in the memory 260, which the data processing system 205 is able to access more quickly than the database system 280, the system 200 may generate reports and execute queries in a relatively fast manner by accessing the index from the memory 260 and using the index 260 to identify relevant portions of the compressed data.

In some implementations, the system 200 may handle a request to access a particular block within the compressed data using the index. For example, the system 200 may access, from the electronic storage, the generated index and identify the particular block within the generated index. In this example, the system 200 may identify, using the index, particular storage locations corresponding to the particular block and access, from the electronic storage, data (e.g., metric values) corresponding to the particular storage locations identified using the index.

The system 200 may use the compressed data and the generated index to generate a report. For example, the system 200 may receive a report generation query that defines a subset of the multiple attribute classes of interest. In response to receiving the report generation query, the system 200 may access, from electronic storage (e.g., the memory 260), the generated index and identify the subset of the multiple attribute classes of interest defined by the report generation query. Using the generated index, the system 200 may identify portions of the compressed data that include a distinct combination of values for the subset of the multiple attribute classes of interest and access, from electronic storage (e.g., the memory 260), metrics (e.g., sales data) for each of the identified portions of the compressed data. Based on the accessed metrics, the system 200 may compute a report parameter (e.g., average sales data) for each of the identified portions of the compressed data and generate a report based on the computed report parameters. The report may list each distinct combination of values for the subset of the multiple attribute classes of interest and the computed report parameter associated with the corresponding distinct combination. The system 200 may display, on a display device, the generated report responsive to the report generation query.

Figure 9:
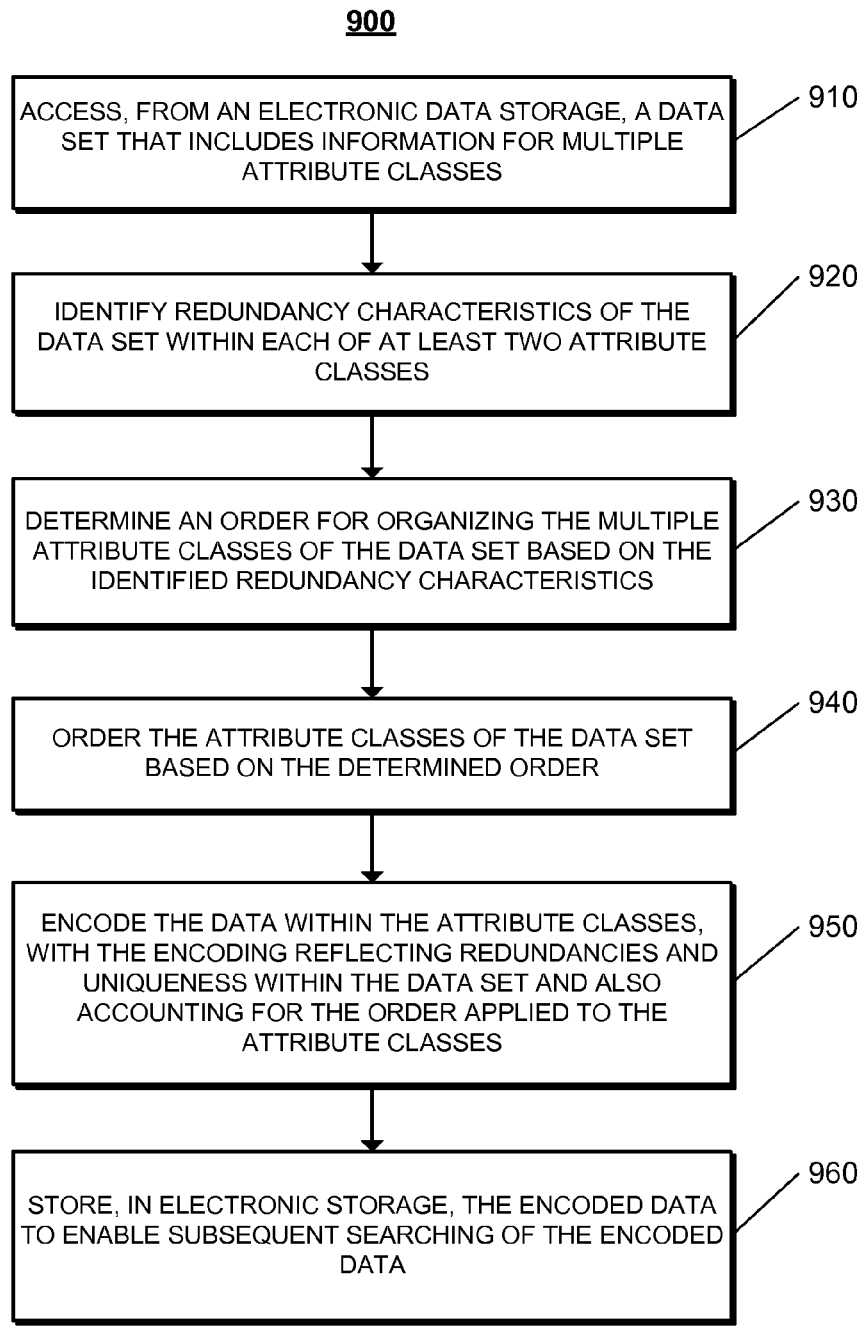

FIG. 9 illustrates a process 900 for encoding data to enable subsequent searching of the encoded data. The operations of the process 900 are described generally as being performed by the system 200. The operations of the process 900 may be performed exclusively by the data processing system 205, may be performed exclusively by the database system 280, or may be performed by a combination of the data processing system 205 and the database system 280. In some implementations, operations of the process 900 may be performed by one or more processors included in one or more electronic devices.

The system 200 accesses, from an electronic data storage, a data set that includes information for multiple attribute classes (910). The system 200 may access the data set that includes information for multiple attribute classes using techniques similar to those described above with respect to reference numeral 310 in FIG. 3.

The system 200 identifies redundancy characteristics of the data set within each of at least two attribute classes (920). The system 200 may identify redundancy characteristics of the data set within each of at least two attribute classes using techniques similar to those described above with respect to reference numeral 320 in FIG. 3.

The system 200 determines an order for organizing the multiple attribute classes of the data set based on the identified redundancy characteristics (930). The system 200 may determine an order for organizing the multiple attribute classes of the data set using techniques similar to those described above with respect to reference numeral 330 in FIG. 3.

The system 200 orders the attribute classes of the data set based on the determined order (940). The system 200 may order the attribute classes of the data set based on the determined order using techniques similar to those described above with respect to reference numeral 340 in FIG. 3.

The system 200 encodes the data within the attribute classes, with the encoding reflecting redundancies and uniqueness within the data set and also accounting for the order applied to the attribute classes (950). For example, the system 200 may identify the first attribute class in the order, sort the data set based on values in the first attribute class, and encode the values in the first attribute class using run length encoding. In this example, the system 200 may identify the next attribute class in the order and identify portions of the data set (e.g., sets of data records included in the data set) that correspond to the groups of identical data values resulting from the run length encoding performed on the first attribute class. For each identified portion of the data set, the system 200 may independently sort and run length encode the values in the next attribute class. The system 200 may continue to encode the data in the remaining attribute classes using the process used to encode the data in the next attribute class. In some examples, the system 200 may encode the data within the attribute classes using techniques similar to those described above with respect to reference numeral 350 in FIG. 3.

The system 200 stores, in electronic storage, the encoded data to enable subsequent searching of the encoded data (960). The system 200 may store the encoded data to enable subsequent searching of the encoded data using techniques similar to those described above with respect to reference numeral 370 in FIG. 3.

FIG. 10 is a schematic diagram of a generic computer system 1000. The system 1000 can be used for the operations described in association with any of the computer-implemented methods described previously. The system 1000 includes a processor 1010, a memory 1020, a storage device 1030, and an input/output device 1040. Each of the components 1010, 1020, 1030, and 1040 are interconnected using a system bus 1050. The processor 1010 is capable of processing instructions for execution within the system 1000. In one implementation, the processor 1010 is a single-threaded processor. In another implementation, the processor 1010 is a multi-threaded processor. The processor 1010 is capable of processing instructions stored in the memory 1020 or on the storage device 1030 to display graphical information for a user interface on the input/output device 1040.

The memory 1020 stores information within the system 1000. In some implementations, the memory 1020 is a computer-readable storage medium. In another implementation, the memory 1020 is a volatile memory unit. In yet another implementation, the memory 1020 is a non-volatile memory unit.

The storage device 1030 is capable of providing mass storage for the system 1000. In some implementation, the storage device 1030 is a computer-readable storage medium. In various different implementations, the storage device 1030 may be a floppy disk device, a hard disk device, an optical disk device, or a tape device.

The input/output device 1040 provides input/output operations for the system 1000. In one implementation, the input/output device 1040 includes a keyboard and/or pointing device. In another implementation, the input/output device 1040 includes a display unit for displaying graphical user interfaces.

The features described can be implemented in digital electronic circuitry, or in computer hardware, firmware, software, or in combinations of them. An apparatus can be implemented in a computer program product tangibly embodied in a machine-readable storage device, for execution by a programmable processor; and method steps can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and a sole processor or one of multiple processors of any kind of computer. Generally, a processor will receive instructions and data from a read-only memory or a random access memory or both. The elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A number of implementations have been described. Nevertheless, it will be understood that various modifications may be made without departing from the spirit and scope of this disclosure. Accordingly, other implementations are within the scope of the following claims.

What is claimed is:

1. A computer-implemented method comprising:
accessing, from an electronic data storage, data stored in the electronic data storage for multiple attribute classes, the accessed data comprising data values stored in the electronic data storage for each of at least two of the multiple attribute classes;
identifying redundancy characteristics of the accessed data within each of the at least two attribute classes by:
analyzing the accessed data values stored in the electronic data storage for each of the at least two attribute classes, and
based on the analysis of the accessed data values stored in the electronic data storage for each of the at least two attribute classes, determining a measure of redundancy within the accessed data values for each of the at least two attribute classes;
accessing a rule that indicates a preference to maintain an order of attribute classes within a dimension of attribute classes despite redundancy characteristics, the dimension of attribute classes defining a subset of attribute classes that have a parent-child relationship;
identifying a dimension of attribute classes included in the multiple attribute classes, the dimension of attribute classes being arranged in a particular order in the electronic data storage based on a parent-child relationship;
determining a relative order among the multiple attribute classes based on the determined measure of redundancy within the accessed data values for each of the at least two attribute classes, including maintaining the particular order of the attribute classes included in the dimension despite the determined measure of redundancy within the accessed data values for each of the at least two attribute classes indicating that a different order of the attribute classes included in the dimension is preferred;
organizing the accessed data based on the determined relative order among the multiple attribute classes;
compressing, using run length encoding, the organized data in the determined relative order among the multiple attribute classes;
generating an index that is descriptive of the compressed data; and
storing, in electronic storage, the encoded data and the generated index to enable subsequent searching of the encoded data using the generated index,
wherein determining the measure of redundancy within the accessed data values for each of the at least two attribute classes comprises:
determining a number of distinct data values within an attribute class;
determining a parameter for a distinct data value within the attribute class, the parameter reflecting contribution of the distinct data value to the entirety of data values within the attribute class; and
determining a redundancy measure for the attribute class based on the number of distinct data values within the attribute class and the determined parameter; and
wherein determining the relative order among the multiple attribute classes based on the determined measure of redundancy within the accessed data values for each of the at least two attribute classes comprises determining the relative order among the multiple attribute classes based on the determined redundancy measure for the attribute class that is based on the number of distinct data values within the attribute class and the determined parameter.

2. The method of claim 1 wherein determining the relative order among the multiple attribute classes comprises:
determining that a first attribute class has a lower number of distinct values than a second attribute class; and
ordering the first attribute class prior to the second attribute class in the determined relative order.

3. The method of claim 1 wherein determining the relative order among the multiple attribute classes comprises:
identifying, from among the multiple attribute classes, an attribute class having a lowest number of distinct values; and
ordering the identified attribute class first in the determined relative order.

4. The method of claim 1 wherein:
determining the measure of redundancy within the accessed data values for each of the at least two attribute classes comprises determining a percentage, within each of the at least two attribute classes, of the accessed data that has a redundant value for the corresponding attribute class; and determining the relative order among the multiple attribute classes based on the determined measure of redundancy within the accessed data values for each of the at least two attribute classes comprises determining the relative order among the multiple attribute classes based on the determined percentages.

5. The method of claim 1 wherein:

the number of distinct data values within the attribute class is a first number of distinct data values within a first attribute class;

the parameter for the distinct data value comprises a first parameter for a first distinct data value, the redundancy measure for the attribute class is a first redundancy measure for the first attribute class, determining the measure of redundancy within the accessed data values for each of the at least two attribute classes further comprises:

determining a second number of distinct data values within a second attribute class, the second number of distinct data values within the second attribute class being lower than the first number of distinct data values within the first attribute class;

determining a second parameter for a second distinct data value within the second attribute class, the second parameter reflecting contribution of the second distinct data value to the entirety of data values within the second attribute class; and determining a second redundancy measure for the second attribute class based on the second number of distinct data values within the second attribute class and the determined second parameter, the second redundancy measure reflecting a lower level of redundancy for the second attribute class than the first redundancy measure reflects for the first attribute class despite the second number of distinct data values within the second attribute class being lower than the first number of distinct data values within the first attribute class; and determining the relative order among the multiple attribute classes based on the determined redundancy measure for the attribute class that is based on the number of distinct data values within the attribute class and the determined parameter comprises determining the relative order among the multiple attribute classes based on the first redundancy measure for the first attribute class and the second redundancy measure for the second attribute class, the first attribute class being ordered prior to the second attribute class in the determined relative order based on the second redundancy measure reflecting a lower level of redundancy for the second attribute class than the first redundancy measure reflects for the first attribute class.

6. The method of claim 1 wherein determining the parameter for the distinct data value comprises determining a rate of occurrence of the distinct data value within the entirety of data values within the attribute class.

7. The method of claim 1, further comprising:

accessing a rule that indicates attribute classes that are searched at a higher frequency than other attribute classes are prioritized in comparison to the other attribute classes in determining an order of attribute classes; and identifying a first attribute class that is included in the multiple attribute classes and that is searched at a higher frequency than a second attribute class that is included in the multiple attribute classes;

wherein determining the relative order among the multiple attribute classes based on the determined measure of redundancy within the accessed data values for each of the at least two attribute classes comprises, based on the identification that the first attribute class is searched at a higher frequency than the second attribute class, determining to order the first attribute class prior to the second attribute class despite the determined measure of redundancy within the accessed data values for each of the at least two attribute classes indicating that ordering the second attribute class prior to the first attribute class is preferred.

8. The method of claim 1 wherein:

the multiple attribute classes are organized in the electronic data storage in a first order; and organizing the accessed data based on the determined relative order among the multiple attribute classes comprises reorganizing the multiple attribute classes in a second order that is different than the first order in which the multiple attribute classes are organized in the electronic data storage.

9. The method of claim 1 wherein:

the multiple attribute classes include at least a first dimension of attribute classes and a second dimension of attribute classes, each of the first and second dimensions defining an exclusive subset of the multiple attribute classes that are related;

the multiple attribute classes are organized in the electronic data storage in a first order that is based on the first and second dimensions such that the exclusive subset of attribute classes included in the first dimension are ordered consecutively and the exclusive subset of attribute classes included in the second dimension are ordered consecutively; and organizing the accessed data based on the determined relative order among the multiple attribute classes comprises reorganizing the multiple attribute classes in a second order in which at least one attribute class included in the first dimension is ordered among the attribute classes included in the second dimension such that the exclusive subset of attribute classes included in the first dimension are no longer ordered consecutively and the exclusive subset of attribute classes included in the second dimension are no longer ordered consecutively.

10. The method of claim 1 wherein:

the multiple attribute classes include a dimension of attribute classes that defines a subset of the multiple attribute classes that have a parent-child relationship;

the multiple attribute classes are organized in the electronic data storage in a first order that is based on the dimension such that parent attribute classes are ordered prior to child attribute classes in the electronic data storage; and organizing the accessed data based on the determined relative order among the multiple attribute classes comprises reorganizing the subset of the multiple attribute classes included in the dimension in a second order in which at least one child attribute class is ordered prior to at least one of its parent attribute classes as defined by the parent-child relationship.

11. The method of claim 1 wherein generating the index that is descriptive of the compressed data comprises:

identifying blocks within the compressed data that have common values;

identifying storage locations of the identified blocks within the compressed data; and associating, within the index, the identified blocks within the compressed data with the corresponding common values and identified storage locations to enable identification of storage locations of a particular block using the index.

12. The method of claim 11 further comprising handling a request to access a particular block within the compressed data by:

accessing, from the electronic storage, the generated index;
identifying the particular block within the generated index;
identifying, using the index, particular storage locations corresponding to the particular block; and
accessing, from the electronic storage, data corresponding to the particular storage locations identified using the index.

13. The method of claim 1 further comprising:

receiving a report generation query that defines a subset of the multiple attribute classes of interest;
accessing, from the electronic storage, the generated index in response to receiving the report generation query;
identifying the subset of the multiple attribute classes of interest defined by the report generation query;
identifying, using the generated index, portions of the compressed data that include a distinct combination of values for the subset of the multiple attribute classes of interest;
accessing, from the electronic storage, metrics for each of the identified portions of the compressed data;
computing a report parameter for each of the identified portions of the compressed data based on the accessed metrics;
generating a report based on the computed report parameters; and
displaying, on a display device, the generated report responsive to the report generation query.

14. An electronic system comprising:

at least one electronic data storage device; and
at least one processor configured to perform operations comprising:
accessing, from an electronic data storage, data stored in the electronic data storage for multiple attribute classes, the accessed data comprising data values stored in the electronic data storage for each of at least two of the multiple attribute classes;
identifying redundancy characteristics of the accessed data within each of the at least two attribute classes by:
analyzing the accessed data values stored in the electronic data storage for each of the at least two attribute classes, and
based on the analysis of the accessed data values stored in the electronic data storage for each of the at least two attribute classes, determining a measure of redundancy within the accessed data values for each of the at least two attribute classes;
accessing a rule that indicates a preference to maintain an order of attribute classes within a dimension of attribute classes despite redundancy characteristics, the dimension of attribute classes defining a subset of attribute classes that have a parent-child relationship;
identifying a dimension of attribute classes included in the multiple attribute classes, the dimension of attribute classes being arranged in a particular order in the electronic data storage based on a parent-child relationship;

determining a relative order among the multiple attribute classes based on the determined measure of redundancy within the accessed data values for each of the at least two attribute classes, including maintaining the particular order of the attribute classes included in the dimension despite the determined measure of redundancy within the accessed data values for each of the at least two attribute classes indicating that a different order of the attribute classes included in the dimension is preferred;
organizing the accessed data based on the determined relative order among the multiple attribute classes;
compressing, using run length encoding, the organized data in the determined relative order among the multiple attribute classes;
generating an index that is descriptive of the compressed data; and
storing, in the at least one electronic data storage device, the compressed data and the generated index to enable subsequent searching of the compressed data using the generated index, wherein determining the measure of redundancy within the accessed data values for each of the at least two attribute classes comprises:
determining a number of distinct data values within an attribute class;
determining a parameter for a distinct data value within the attribute class, the parameter reflecting contribution of the distinct data value to the entirety of data values within the attribute class; and
determining a redundancy measure for the attribute class based on the number of distinct data values within the attribute class and the determined parameter; and wherein determining the relative order among the multiple attribute classes based on the determined measure of redundancy within the accessed data values for each of the at least two attribute classes comprises determining the relative order among the multiple attribute classes based on the determined redundancy measure for the attribute class that is based on the number of distinct data values within the attribute class and the determined parameter.

15. A computer-implemented method comprising:

accessing, from an electronic data storage, data stored in the electronic data storage for multiple attribute classes, the accessed data comprising data values stored in the electronic data storage for each of at least two of the multiple attribute classes;
identifying redundancy characteristics of the accessed data within each of the at least two attribute classes by:
analyzing the accessed data values stored in the electronic data storage for each of the at least two attribute classes, and
based on the analysis of the accessed data values stored in the electronic data storage for each of the at least two attribute classes, determining a measure of redundancy within the accessed data values for each of the at least two attribute classes;
accessing a rule that indicates a preference to maintain an order of attribute classes within a dimension of attribute classes despite redundancy characteristics, the dimension of attribute classes defining a subset of attribute classes that have a parent-child relationship;
identifying a dimension of attribute classes included in the multiple attribute classes, the dimension of attribute classes being arranged in a particular order in the electronic data storage based on a parent-child relationship;

determining a relative order among the multiple attribute classes based on the determined measure of redundancy within the accessed data values for each of the at least two attribute classes, including maintaining the particular order of the attribute classes included in the dimension despite the determined measure of redundancy within the accessed data values for each of the at least two attribute classes indicating that a different order of the attribute classes included in the dimension is preferred;

ordering the multiple attribute classes within the accessed data based on the determined relative order among the multiple attribute classes;

encoding the accessed data within the ordered multiple attribute classes, with the encoding reflecting redundancies and uniqueness within the accessed data and accounting for the determined relative order among the multiple attribute classes; and storing, in electronic storage, the encoded data to enable subsequent searching of the encoded data, wherein determining the measure of redundancy within the accessed data values for each of the at least two attribute classes comprises:

determining a number of distinct data values within an attribute class;

determining a parameter for a distinct data value within the attribute class, the parameter reflecting contribution of the distinct data value to the entirety of data values within the attribute class; and determining a redundancy measure for the attribute class based on the number of distinct data values within the attribute class and the determined parameter; and wherein determining the relative order among the multiple attribute classes based on the determined measure of redundancy within the accessed data values for each of the at least two attribute classes comprises determining the relative order among the multiple attribute classes based on the determined redundancy measure for the attribute class that is based on the number of distinct data values within the attribute class and the determined parameter.

16. A computer-implemented method comprising:

accessing, from an electronic data storage, data that includes information for multiple attribute classes;

identifying redundancy characteristics of the accessed data within each of at least two of the multiple attribute classes;

identifying a search frequency for each of the at least two attribute classes;

determining a relative order among the multiple attribute classes based on:

the identified redundancy characteristics of the accessed data within each of at least two attribute classes, and the identified search frequency for each of the at least two attribute classes;

organizing the accessed data based on the determined relative order among the multiple attribute classes;

compressing, using run length encoding, the organized data in the determined relative order among the multiple attribute classes;

generating an index that is descriptive of the compressed data; and storing, in electronic storage, the encoded data and the generated index to enable subsequent searching of the encoded data using the generated index, wherein identifying redundancy characteristics of the accessed data within each of at least two of the multiple attribute classes comprises:

determining a number of distinct data values within an attribute class;

determining a parameter for a distinct data value within the attribute class, the parameter reflecting contribution of the distinct data value to the entirety of data values within the attribute class; and determining a redundancy measure for the attribute class based on the number of distinct data values within the attribute class and the determined parameter; and wherein determining the relative order among the multiple attribute classes comprises determining the relative order among the multiple attribute classes based on the determined redundancy measure for the attribute class that is based on the number of distinct data values within the attribute class and the determined parameter, and wherein determining the relative order among the multiple attribute classes further comprises:

accessing a rule that indicates attribute classes that are searched at a higher frequency than other attribute classes are prioritized in comparison to the other attribute classes in determining an order of attribute classes;

identifying a first attribute class that is included in the multiple attribute classes and that is searched at a higher frequency than a second attribute class that is included in the multiple attribute classes; and based on the identification that the first attribute class is searched at a higher frequency than the second attribute class, determining to order the first attribute class prior to the second attribute class despite the identified redundancy characteristics indicating that ordering the second attribute class prior to the first attribute class is preferred.

17. The method of claim 16, wherein determining the relative order among the multiple attribute classes comprises overriding the identified redundancy characteristics based on the identified search frequency.

\* \* \* \* \*